United States Patent
Hayashi et al.

(10) Patent No.: US 8,781,787 B2
(45) Date of Patent: Jul. 15, 2014

(54) SUBSTRATE CARRYING MECHANISM, SUBSTRATE CARRYING METHOD AND RECORDING MEDIUM STORING PROGRAM INCLUDING SET OF INSTRUCTIONS TO BE EXECUTED TO ACCOMPLISH THE SUBSTRATE CARRYING METHOD

(75) Inventors: Tokutarou Hayashi, Koshi (JP); Kiminari Sakaguchi, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 336 days.

(21) Appl. No.: 13/213,445

(22) Filed: Aug. 19, 2011

(65) Prior Publication Data
US 2012/0046904 A1 Feb. 23, 2012

(30) Foreign Application Priority Data

Aug. 20, 2010 (JP) .................................. 2010-185068
Feb. 23, 2011 (JP) .................................. 2011-037159

(51) Int. Cl.
*G06F 15/00* (2006.01)

(52) U.S. Cl.
USPC ........... 702/150; 702/182; 700/214; 700/245; 355/53; 355/72; 451/5; 451/6; 451/10; 451/11

(58) Field of Classification Search
USPC .......... 702/150, 182; 700/214, 245, 213, 254, 700/112, 302, 66; 355/27, 53, 72, 75; 414/222.01, 217, 222.02, 222.13, 806, 414/936; 118/708, 712; 427/240, 331; 451/5, 6, 10, 11
See application file for complete search history.

(56) References Cited

U.S. PATENT DOCUMENTS

| | | | |
|---|---|---|---|
| 6,184,972 B1 * | 2/2001 | Mizutani et al. | 355/72 |
| 6,201,603 B1 | 3/2001 | Miura | |
| 6,400,445 B2 * | 6/2002 | Nishi et al. | 355/72 |
| 6,409,576 B1 * | 6/2002 | Oguri et al. | 451/6 |
| 6,901,314 B2 * | 5/2005 | Mitsui et al. | 700/245 |

(Continued)

FOREIGN PATENT DOCUMENTS

| EP | 0 597 637 A1 | 5/1994 |
|---|---|---|
| EP | 1 791 169 A1 | 5/2007 |

(Continued)

OTHER PUBLICATIONS

Extended European Search Report dated May 21, 2012.

(Continued)

*Primary Examiner* — Carol S Tsai
(74) *Attorney, Agent, or Firm* — Burr & Brown, PLLC

(57) ABSTRACT

A substrate carrying mechanism includes: a base; a substrate holding member placed on the base and capable of holding a substrate and of being advanced and retracted relative to the base; four or more detecting units respectively for detecting different parts of the edge of a substrate held by the substrate holding member when the substrate holding member holding a substrate is retracted; and a controller that determines whether or not a notch formed in the edge of the substrate has been detected by one of the detecting units, on the basis of measurements measured by the four or more detecting units and corrects an error in a transfer position where the substrate is to be transferred to the succeeding processing unit on the basis of measurements measured by the detecting units excluding the one detecting unit that has detected the notch of the substrate.

20 Claims, 26 Drawing Sheets

(56) References Cited

U.S. PATENT DOCUMENTS

| | | | |
|---|---|---|---|
| 7,019,817 B2 * | 3/2006 | Hashimoto et al. | 355/72 |
| 7,075,621 B2 * | 7/2006 | Mitsui et al. | 355/53 |
| 7,480,050 B2 * | 1/2009 | Den Boef et al. | 356/364 |
| 7,607,967 B2 * | 10/2009 | Naoki et al. | 451/5 |
| 7,884,622 B2 * | 2/2011 | Doki et al. | 324/658 |
| 8,055,376 B2 * | 11/2011 | Doki et al. | 700/214 |
| 8,057,602 B2 * | 11/2011 | Koelmel et al. | 118/730 |
| 8,086,348 B2 * | 12/2011 | Alberti et al. | 700/228 |
| 8,101,934 B2 * | 1/2012 | Chen et al. | 250/559.36 |
| 8,433,436 B2 * | 4/2013 | Doki et al. | 700/214 |
| 2002/0002422 A1 | 1/2002 | Kondo et al. | |
| 2002/0127852 A1 | 9/2002 | Kawakami et al. | |
| 2002/0134179 A1 | 9/2002 | Maruyama et al. | |
| 2003/0185664 A1 * | 10/2003 | Mitsui et al. | 414/935 |
| 2005/0110974 A1 * | 5/2005 | Hashimoto et al. | 355/72 |
| 2006/0169208 A1 | 8/2006 | Shinozaki et al. | |
| 2007/0141951 A1 * | 6/2007 | Naoki et al. | 451/5 |
| 2007/0190437 A1 * | 8/2007 | Kaneyama et al. | 430/30 |
| 2008/0006785 A1 * | 1/2008 | Chen et al. | 250/559.3 |
| 2008/0056857 A1 | 3/2008 | Hiroki | |
| 2008/0102200 A1 * | 5/2008 | Doki et al. | 427/240 |
| 2009/0051370 A1 * | 2/2009 | Doki et al. | 324/658 |
| 2010/0070054 A1 * | 3/2010 | Solomon | 700/90 |
| 2011/0205354 A1 | 8/2011 | Enomoto et al. | |
| 2011/0280693 A1 * | 11/2011 | Hofmeister et al. | 414/222.13 |
| 2012/0072005 A1 * | 3/2012 | Doki et al. | 700/114 |

FOREIGN PATENT DOCUMENTS

| | | |
|---|---|---|
| JP | 08-031905 A1 | 2/1996 |
| JP | 11-243129 A1 | 9/1999 |
| JP | 2001-237294 A1 | 8/2001 |
| JP | 2002-261146 A1 | 9/2002 |
| JP | 2006-351884 A1 | 12/2006 |
| JP | 2007-335613 A1 | 12/2007 |
| WO | 02/021589 A1 | 3/2002 |
| WO | 2010/038735 A1 | 4/2010 |

OTHER PUBLICATIONS

Japanese Office Action (Application No. 2011-037159) dated Dec. 3, 2013.

* cited by examiner

SUBSTRATE CARRYING MECHANISM, SUBSTRATE CARRYING METHOD AND RECORDING MEDIUM STORING PROGRAM INCLUDING SET OF INSTRUCTIONS TO BE EXECUTED TO ACCOMPLISH THE SUBSTRATE CARRYING METHOD

BACKGROUND OF THE INVENTION

1. Field of the Invention

The present embodiment relates to a substrate carrying mechanism for carrying a substrate, a substrate carrying method, and a recording medium storing a program including a set of instructions to be executed to accomplish the substrate carrying method.

2. Description of Related Art

A semiconductor device fabricating system for fabricating semiconductor devices or LCD panels (liquid crystal display panels) is provided with processing modules that process substrates (hereinafter, referred to also as "wafers"). A substrate carrying mechanism carries substrates sequentially to the processing modules to subject the substrates to predetermined processes. The substrate carrying mechanism has, for example, a base, and a substrate holding fork capable of being advanced and being retracted along the base, of turning about a vertical axis and of moving vertically.

Substrate carrying mechanisms mentioned in, for example, Patent documents 1 and 2 are provided with sensors for determining whether or not a substrate received from the processing module is held at a correct position on the holding fork.

A semiconductor device fabricating system disclosed in Patent document 1 is provided with a substrate carrying mechanism including a carrying robot having an arm, i.e., holding fork, for holding a substrate. This semiconductor device fabricating system determines a positional error of a substrate in each of a plurality of units of the semiconductor device fabricating system from the position of the substrate on the arm (holding fork). The semiconductor device fabricating system is provided with correcting means for correcting the positional error of the substrate by adjusting a carrying distance for which the substrate is carried between the units. The positional error of the substrate is determined by measuring positions of a plurality of parts of the edge of the substrate.

The substrate carrying mechanism disclosed in Patent document 2 has a carrying arm unit, a pick-up unit (holding fork), a position measuring unit for measuring the position of a substrate, a center-position calculating unit, a displacement calculating unit, and an arm control unit. The position measuring unit mentioned in Patent document 2 is mounted on the pick-up unit (holding fork) to measure the position of a substrate held by the pick-up unit. The center-position calculating unit calculates the position of the center of the substrate by using data provided by the position measuring unit. The displacement calculating unit calculates a positional error of the center of the substrate with respect to a predetermined reference position. The arm control unit controls the movement of the carrying arm unit such that the positional error of the center of the substrate is corrected while the substrate held by the pick-up unit (holding fork) is being carried to a desired position.

PATENT DOCUMENTS

Patent document 1: JP-A H8-31905
Patent document 2: JP-A 2006-351884

SUMMARY OF THE INVENTION

The following problems lie in those substrate carrying mechanisms and substrate carrying methods mentioned in Patent documents 1 and 2.

The substrate carrying, mechanism disclosed in Patent document 1 is provided with only two sensors. Therefore, a two-dimensional positional error of a wafer in a horizontal plane cannot be accurately measured. The substrate carrying mechanism disclosed in Patent document 2 is provided with three position measuring units and hence a two-dimensional positional error of a wafer in a horizontal plane can be measured.

Some semiconductor substrate, namely, wafer, is provided with a notch to be used for positioning the wafer in its edge. The substrate carrying mechanism disclosed in Patent document 2 determines the position of the edge of a wafer by data provided by the three position measuring units. When one of the position measuring units measures the position of a part of the notch, the part of the notch is understood to be a part of the edge not provided with the notch. Therefore, if one of the position measuring unit measures the position of a part of the notch, a positional error of the wafer cannot be accurately determined.

A known holding fork is provided with a guide structure having a guide wall having a downward tapered inner surface that surrounds a wafer to position a wafer at a correct horizontal position on the holding fork. A wafer placed on the holding fork is guided to a predetermined position on the holding fork by the guide structure. When a wafer coated with a coating film, such as a resist film, drops to the predetermined position on the holding fork, there is the possibility that coating film coating the edge of the wafer is abraded by the guide wall and particles are produced.

In some cases, a holding fork that positions a wafer at a horizontal position by holding the wafer by using, for example, vacuum attraction instead of using the guide structure. Since the holding fork that holds a wafer by vacuum attraction is not provided with the guide structure, the wafer is liable to be dislocated in a horizontal plane. There is the possibility that a trouble is caused in the holding fork or the wafer by some cause and the position measuring units can operate abnormally under such a condition.

The present embodiment has been made in consideration of such problems and it is therefore an object of the present embodiment to provide a substrate carrying mechanism and a substrate carrying method capable of accurately measuring a positional error of a substrate provided with a notch in its edge while the substrate held by a folding fork is being carried, of readily correcting the positional error of the displaced substrate, and of finding and correcting the state of the holding fork and the state of the substrate or position measuring units simultaneously.

The present embodiment is characterized by the following means for solving the foregoing problems.

A substrate carrying mechanism in a first aspect of the present embodiment includes: a base; a substrate holding member placed on the base and capable of holding a substrate and of being advanced and retracted relative to the base; four or more detecting units respectively for detecting different parts of the edge of a substrate held by the substrate holding member when the substrate holding member holding the substrate is retracted; and a controller that decides whether or not a notch formed in the edge of the substrate has been detected by one of the detecting units on the basis of measurements measured by the four or more detecting units and corrects an error in a transfer position where the substrate is to be transferred to a succeeding processing unit on the basis of measurements measured by the detecting units excluding the one detecting unit that detected the notch of the substrate.

A substrate carrying mechanism in a second aspect of the present embodiment includes: a base; a substrate holding member capable of holding a substrate and of being advanced and retracted relative to the base; three detecting units that detect different parts of the edge of a substrate held by the substrate holding member when the substrate holding member holding the substrate is retracted; and a controller that decides whether or not a part of a notch formed in the edge of a substrate received from a processing unit has been detected by one of the detecting units on the basis of measurements measured by the three detecting units, moves the substrate holding member relative to the detecting units when it is decided that one of the detecting units has detected a part of the notch such that no part of the notch will be detected by any one of the detecting units, makes the detecting units detect parts of the edge of the substrate after the substrate holding member has been moved relative to the detecting units, and determines a transfer position where the substrate is to be transferred to a succeeding processing unit on the basis of measurements measured by the detecting units after the substrate holding member has been moved relative to the detecting units.

A substrate carrying method in a third aspect of the present embodiment, to be carried out by a substrate carrying mechanism including a base, a substrate holding member capable of holding a substrate, placed on the base and capable of being advanced and retracted relative to the base, and four or more detecting units for detecting different parts of the edge of a substrate held by the substrate holding member when the substrate holding member holding a substrate received from a processing unit is retracted, includes the steps of: deciding whether or not a part of a notch formed in the edge of a substrate received from a processing unit has been detected by one of the detecting units on the basis of measurements measured by the detecting units; and determining, if a part of the notch formed in the edge of the substrate received from the processing unit has been detected by one of the detecting units, a transfer position where the substrate is to be transferred to a succeeding processing unit on the basis of the measurements measured by the detecting units excluding the one detecting unit that has detected the part of the notch of the substrate.

A substrate carrying method in a third aspect of the present embodiment, to be carried out by a substrate carrying mechanism including a base, a substrate holding member capable of holding a substrate and of being advanced and retracted relative to the base, and three detecting units that detect different parts of the edge of a substrate held by the substrate holding member when the substrate holding member holding the substrate is retracted, includes the steps of: deciding whether or not a part of a notch formed in the edge of a substrate received from a processing unit has been detected by one of the detecting units on the basis of measurements measured by the three detecting units, moving the substrate holding member relative to the detecting units such that no part of the notch will be detected by any one of the detecting units when it is decided that a part of the notch has been detected by one of the detecting units; making the detecting units remeasure positions of parts of the edge of the substrate after the substrate holding member has been moved relative to the detecting units; and determining a transfer position where the substrate is to be transferred to a succeeding processing unit on the basis of measurements remeasured by the detecting units after the substrate holding member has been moved relative to the detecting units.

The substrate carrying mechanism and the substrate carrying method according to the present embodiment can accurately measure a displacement of a substrate having a notch formed in its edge from the reference position when the substrate is held and carried by the substrate holding member, can readily correct a positional error of the substrate, and can find and correct the state of the substrate holding member and the state of the substrate or the detecting units.

DETAILED DESCRIPTION OF THE INVENTION

A substrate processing system provided with a substrate carrying mechanism according to the present embodiment will be described as applied to a coating and developing system.

First Embodiment

A resist pattern forming system built by connecting an exposure system to a coating and developing system, namely, a substrate processing system relating to a first embodiment according to the present embodiment will be briefly described with reference to FIGS. 1 to 4.

Figure 1:
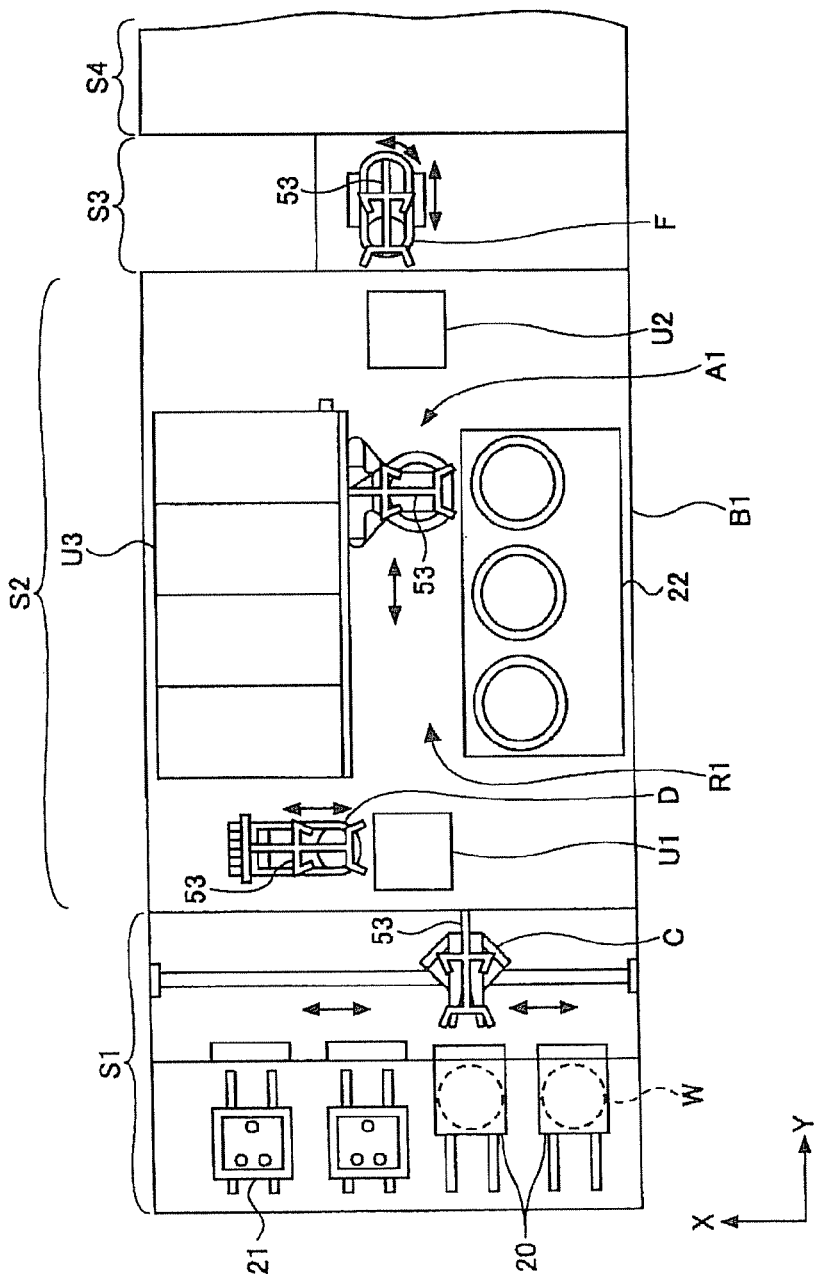
FIG. 1 is a plan view of a resist pattern forming system relating to a first embodiment according the present embodiment.
Figure 2:
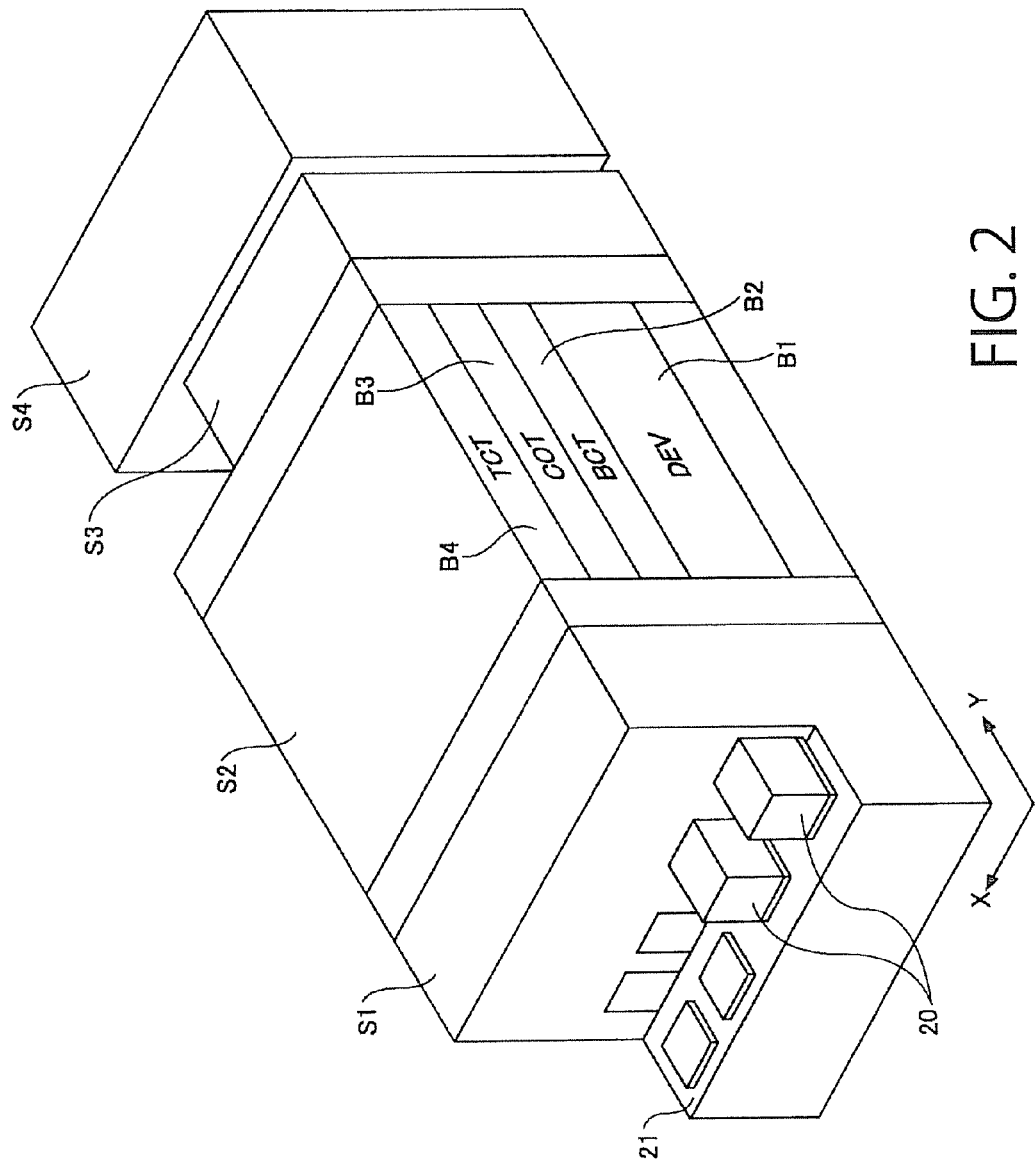
FIG. 2 is a schematic perspective view of the resist pattern forming system relating to the first embodiment.
Figure 3:
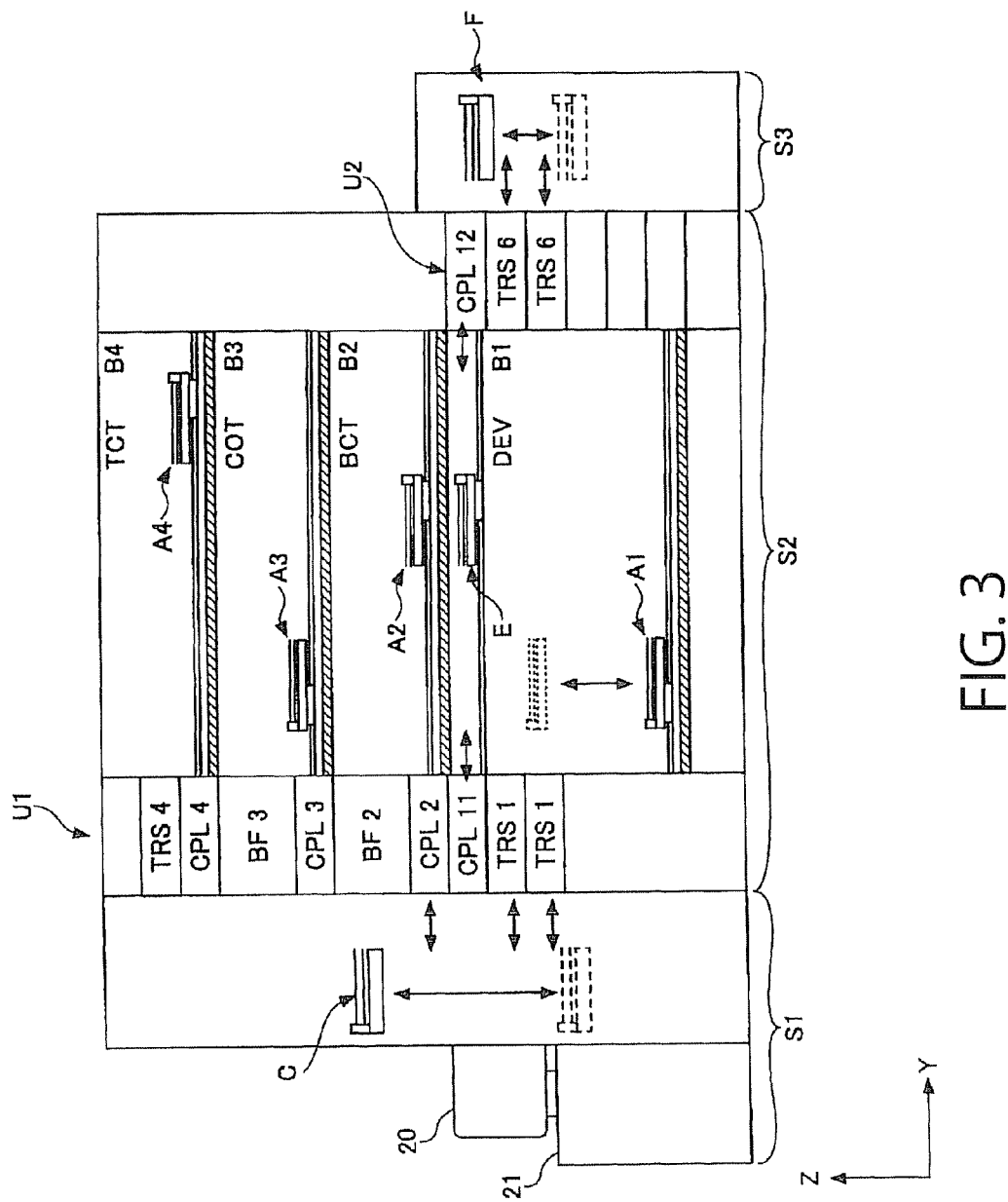
FIG. 3 is a side view of the resist pattern forming system relating to the first embodiment.
Figure 4:
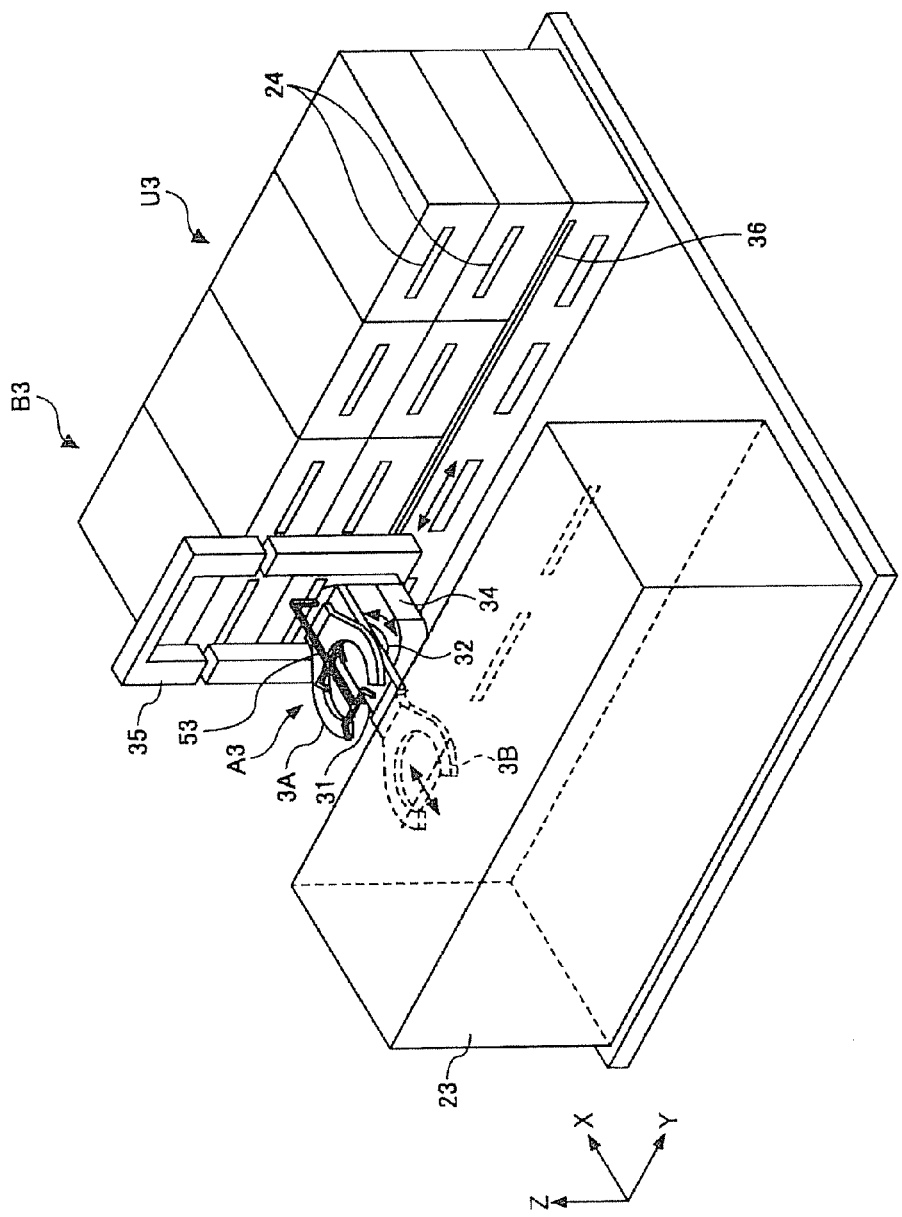
FIG. 4 is a perspective view of a third unit.

FIG. 1 is a plan view of a resist pattern forming system relating to the first embodiment. FIG. 2 is a schematic perspective view of the resist pattern forming system relating to the first embodiment. FIG. 3 is a side view of the resist pattern forming system relating to the first embodiment. FIG. 4 is a perspective view of a third unit, namely a COT layer.

Referring to FIGS. 1 and 2, the resist pattern forming system has a carrier block S1, a processing block S2 and an interface block S3. An exposure system S4 is connected to the interface block S3 of the resist pattern forming system. The carrier block S1, the processing block S2, the interface block S3 and the exposure system S4 are arranged and connected in that order.

The carrier block S1 has carrier support tables 21 and a transfer device C. Carriers 20 are placed on the carrier support tables 21. The transfer device C takes out a wafer W from the carrier 20 and transfers the wafer W to the processing block S2. The transfer device C receives a processed wafer W processed in the processing block S2 and returns the processed wafer W into the carrier 20.

Referring to FIGS. 1 and 2, the processing block S2 has a shelf unit U1, a shelf unit U2, a first processing unit (DEV layer) B1, a second processing unit (BCT layer), a third processing unit (COT layer) B3 and a fourth processing unit (TCT layer) B4. The first processing unit (DEV layer) B1 carries out a developing process. The second processing unit (BCT layer) B2 carries out an antireflection film forming process for forming an antireflection film under a resist film.

The third processing unit (COT layer) B3 carries out a resist solution application process. The fourth processing unit (TCT layer) B4 carries out an antireflection film forming process for forming an antireflection film over a resist film.

The shelf unit U1 is formed by stacking up different types of modules. As shown in FIG. 3 by way of example, a transfer modules TRS1, TRS1, CPL11, CPL2, BF2, CPL3, BF3, CPL4 and TRS4 are stacked up in that order in the shelf unit U1. As shown in FIG. 1, a vertically movable transfer arm D is installed near the shelf unit U1. The transfer arm D carries a wafer W from one to another of the processing modules of the shelf unit U1.

The shelf unit U2 is formed by stacking up different types of processing modules. As shown in FIGS. 2 and 3 by way of example, transfer modules TRS6, TRS6 and CPL12 are stacked up in that order in the shelf unit U2.

The transfer modules indicated by a symbol CPL in FIG. 3 serve also as cooling modules. The transfer modules indicated by a symbol BF in FIG. 3 serve also buffer modules each capable of storing a plurality of wafers W.

Referring to FIGS. 1 and 3, the first processing unit (DEV layer) 81 has developing modules 22, a carrying arm A1 and a shuttle arm E. The developing modules 22 are stacked up in two layers in the first processing unit (DEV layer) B1. The carrying arm A1 carries a wafer W to the developing modules 22 stacked up in two layers; that is, the carrying arm A1 carries wafers W to both the developing modules stacked up in two layers. The shuttle arm E carries a wafer W from the transfer module CPL11 of the shelf unit U1 directly to the transfer module CPL12 of the shelf unit U2.

The second processing unit (BCT layer) 82, the third processing unit (COT layer) B3 and the fourth processing unit (TCT layer) B4 have coating modules and processing modules, such as heating/cooling modules, and carrying arms A2, A3 and A4, respectively. The processing modules carry out a pretreatment process before a coating process to be carried out by the coating module, and a posttreatment process after the coating process. The carrying arms A2, A3 and A4 are installed between the coating modules and the processing modules to transfer a wafer W from one to another of the coating modules and the processing modules.

The second processing unit (BCT layer) B2, the third processing unit (COT layer) B3 and the fourth processing unit (TCT layer) B4 are the same in construction and use different chemical solutions, respectively. The chemical solution to be used by the second processing unit (BCT layer) B2 and the fourth processing unit (TCT layer) B4 is an antireflection film forming solution, and the chemical solution to be used by the third processing unit (COT layer) B3 is a resist solution.

The carrying arms A1 to A4 correspond to substrate carrying mechanisms of the present embodiment. The carrying arms A1 to A4 will be described later.

The transfer device C, the transfer arm D and an interface arm F correspond to substrate carrying mechanisms of the present embodiment as well. Hereinafter, the carrying arms A1 to A4 will be described as substrate carrying mechanisms as typical examples of the carrying arms A1 to A4, the transfer device C, the transfer arm D and the interface arm F.

As shown in FIG. 1, the carrying arm A1 is provided with a support member 53 for supporting detecting units 5. The transfer device C, the transfer arm D and the interface arm F may be provided with a support member 53 for supporting detecting units 5 as shown in FIG. 1.

Referring to FIG. 4, the third processing unit (COT layer) B3 will be described as a typical example of the second processing unit (BCT layer) B2, the third processing unit (COT layer) B3 and the fourth processing unit (TCT layer) B4.

The third processing unit (COT layer) 63 has a coating module 23, a shelf unit U3 and the carrying arm A3. The shelf unit U3 is built by stacking up processing modules serving as thermal processing modules, such as heating modules and cooling modules. The shelf unit U3 is disposed opposite to the coating module 23. The carrying arm A3 moves in a space between the coating module 23 and the shelf unit U3. Indicated at 4 in FIG. 4 are transfer openings through which a wafer W is transferred between the carrying arm A3 and each processing module.

As shown in FIG. 1, the interface arm F is installed in the interface block S3 near the shelf unit U2 of the processing block S2. The interface arm F transfers a wafer W between the exposure system S4 and each of the processing modules of the shelf unit U2.

The transfer device C transfers wafers W sequentially from the carrier block S1 to one of the transfer modules of the shelf unit U1, such as the transfer module CPL2 corresponding to the second processing unit (BCT layer) B2. The wafer W transferred to the transfer module CPL2 is transferred to the carrying arm A2 of the second processing unit (BCT layer) B2. Then, the carrying arm A2 carries the wafer W to one of the processing modules, such as the coating modules and the thermal processing modules. The processing module received the wafer W processes the wafer W to form an antireflection film on the wafer W.

The wafer W coated with the antireflection film is transferred through the carrying arm A2, the transfer module BF2 of the shelf unit U1, the transfer arm D, and the transfer module CPL3 of the shelf unit U1 to the carrying arm A3 of the third processing unit (COT layer) B3. The carrying arm A3 carries the wafer W to the processing modules, such as the coating module and the thermal processing module, and then the processing module forms a resist film on the wafer W.

After the resist film has been formed on the wafer W, the carrying arm A3 carries the wafer W to the transfer module BF3 of the shelf unit U1.

An antireflection film is formed over the resist film formed on the wafer W in the fourth processing unit (TCT layer) B4 in case of need. When an antireflection film needs to be formed over the resist film, the wafer W is transferred through the transfer module CPL4 to the carrying arm A4 of the fourth processing unit (TCT layer) B4. The carrying arm A4 carries the wafer W to the processing modules which form an antireflection film over the resist film, such as the coating module and the thermal processing module. After the antireflection film has been formed on the wafer W, the carrying arm A4 carries the wafer to the transfer module TRS4 of the shelf unit U1.

The wafer W provided with the resist film or with the resist film and the antireflection film formed on the resist film is transferred through the transfer arm D, the transfer modules BF3 and TRS4 to the transfer module CPL11. The shuttle arm E carries the wafer W from the transfer module CPL11 directly to the transfer module CPL12. Then, the interface arm F of the interface block S3 receives the wafer W from the transfer module CPL12.

The interface arm F carries the wafer W to the exposure system S4 to subject the wafer W to a predetermined exposure process. The interface arm F transfers the wafer W processed by the exposure process to the transfer module TRS6 of the shelf unit U2 in the processing block S2. Then, the wafer W is subjected to a developing process in the first processing unit (DEV layer) B1. The wafer W processed by the developing process is returned through the carrying arm A1, the transfer module TRS1 of the shelf unit U1 and the transfer device C to the carrier 20.

Figure 5:
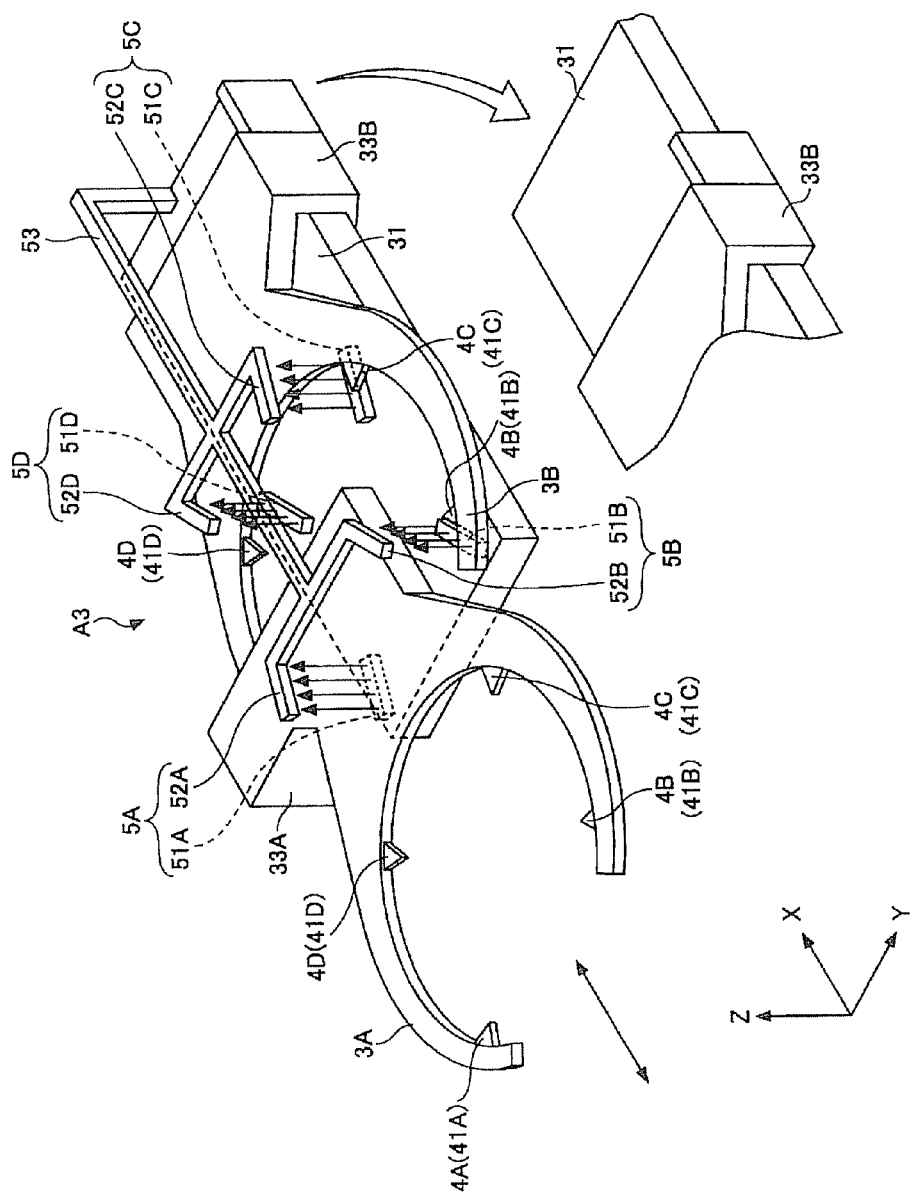
FIG. 5 is a perspective view of a carrying arm included in a substrate carrying mechanism in the first embodiment of the present embodiment.

The carrying arms A1 to A4, namely, the substrate carrying mechanisms of the present embodiment, will be described with reference to FIGS. 4 to 6. Since the carrying arms A1 to A4 are the same in construction, the carrying arm A3 installed in the third processing unit (COT layer) B3 will be described by way of example. FIG. 5 is a perspective view of the carrying arm A3, and FIGS. 6A and 6B are a plan view and a side view, respectively, of the carrying arm A3.

Figure 6:
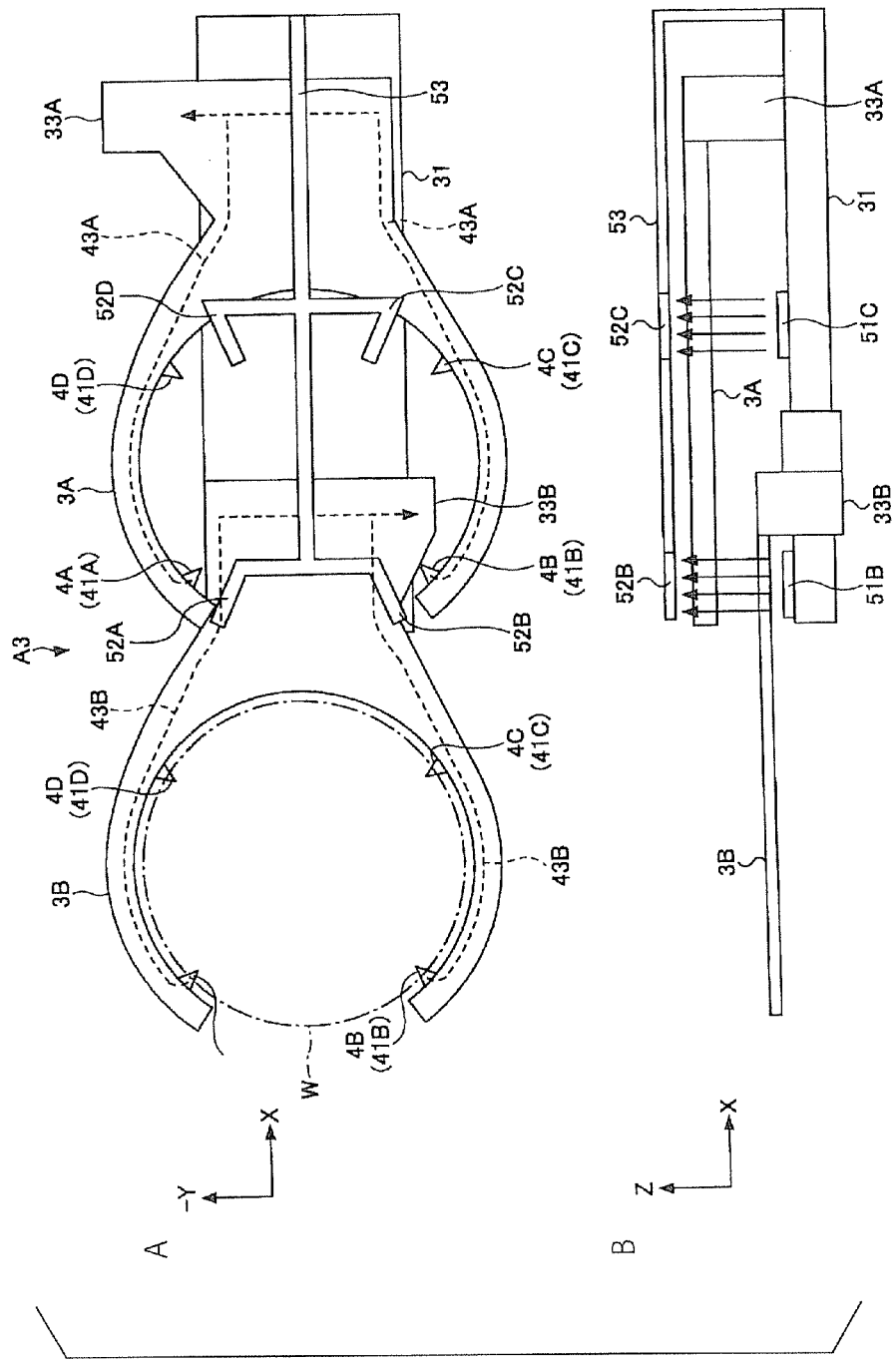
FIGS. 6A and 6B are a plan view and a side view, respectively, of the carrying arm included in the substrate carrying mechanism in the first embodiment of the present embodiment.

Referring to FIGS. 4 to 6, the carrying arm A3 has two holding forks 3 (3A and 3B), a base 31, a turning mechanism 32, linear drive mechanisms 33A and 33B, a lifting table 34, detecting units 5 (5A to 5D) and a controller 6. The controller 6 will be described later with reference to FIGS. 8 and 9.

The two holding forks 3A and 3B are arranged such that the holding forks 3A and 3B can overlap each other. The base 31 can be turned about a vertical axis by the turning mechanism 32. The holding forks 3A and 3B have base end parts supported on the linear drive mechanisms 33A and 33B, respectively. The holding forks 3A and 3B can be advanced and retracted relative to the base 31 by the linear drive mechanisms 33A and 33B, respectively.

The holding forks 3 (3A and 3B) correspond to the holding units of the present embodiment. The holding forks 3A and 3B do not necessarily need to be arranged vertically and may be horizontally arranged. The number of the holding forks may be one or may be three or greater. The plurality holding forks may be arranged either in a vertical or a horizontal arrangement.

Figure 9:
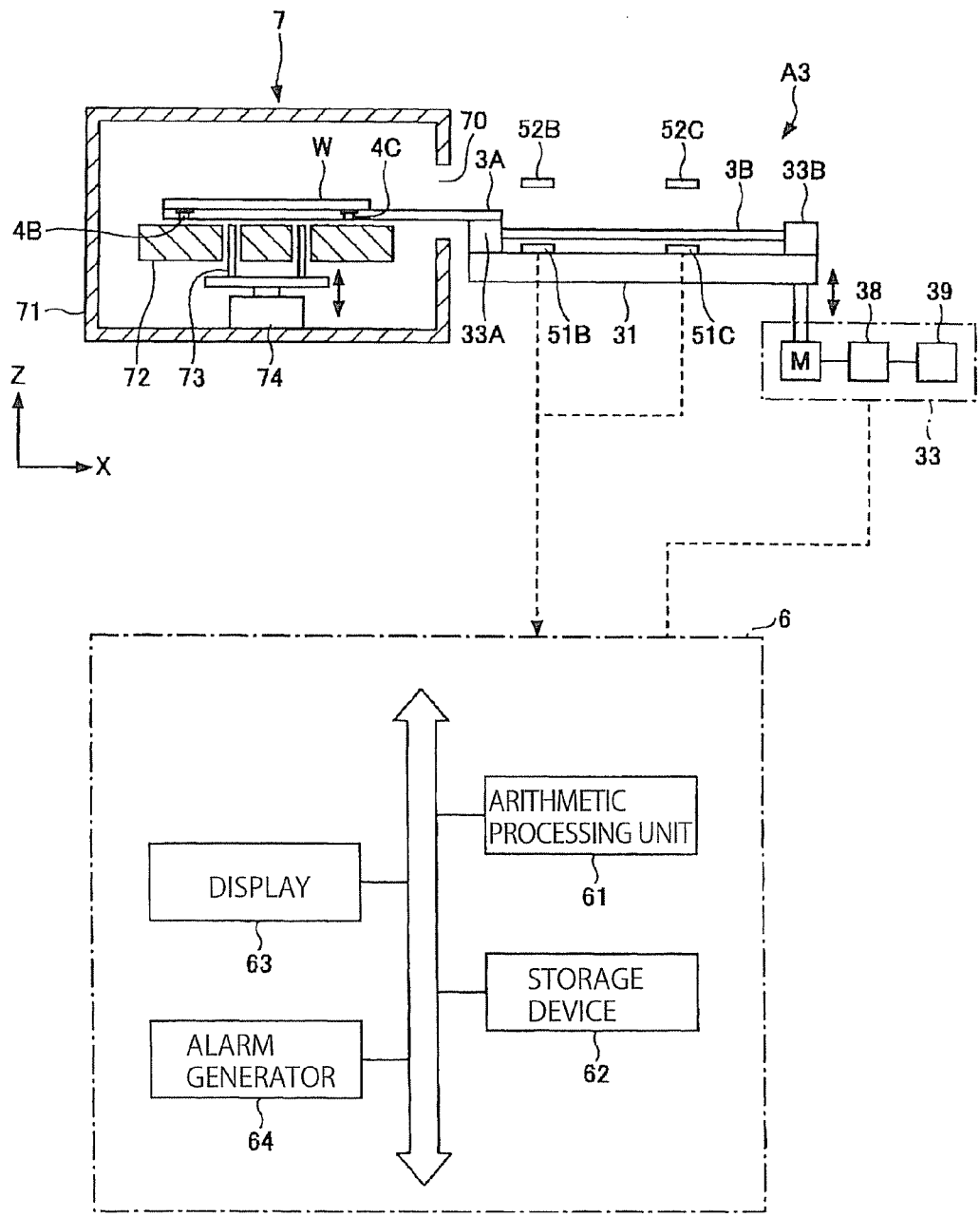
FIG. 9 is a block diagram of the controller shown in combination with a schematic, sectional side view of the carrying arm and a heating module included in the third unit.

The linear drive mechanisms 33A and 33B are placed inside the base 31. A motor M shown in FIG. 9 is interlocked with the linear drive mechanisms 33A and 33B by a transmission mechanism using timing belts or the like. The motor M drives the linear drive mechanisms 33A and 33B to advance and retract the holding forks 3A and 3B relative to the base 31. The transmission mechanism may be a generally known one, such as a ball screw mechanism or a power transmission using timing belts.

In FIG. 9, a drive mechanism 33 for driving the linear drive mechanisms 33A and 33B is disposed below the base 31. The motor M drives the linear drive mechanisms 33A and 33B to advance and retract the holding forks 3A and 3B relative to the base 31. An encoder 38 is connected to the motor M. A pulse counter 39 shown in FIG. 9 counts pulses generated by the encoder 38.

As shown in FIG. 4, the lifting table 34 lies under the turning mechanism 32. The lifting table 34 can be vertically moved along a straight, vertical Z-axis guide rail, not shown, parallel to the Z-axis by a lifting mechanism. The lifting mechanism may be a generally known mechanism, such as a ball screw mechanism or a mechanism using a timing belt. In this embodiment, the Z-axis guide rail and the lifting mechanism are covered with a cover 35. Upper vertical end parts of the cover 35 are connected. The cover 35 can slide along a straight Y-axis guide rail 36 parallel to the Y-axis.

Figure 7:
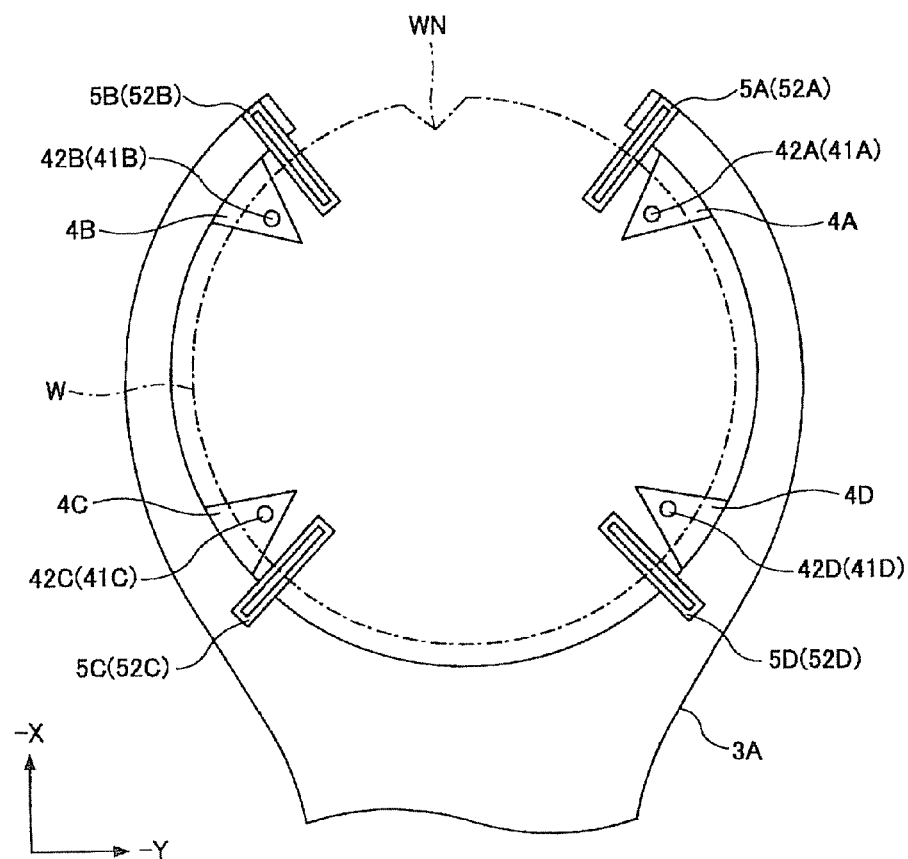
FIG. 7 is an enlarged plan view of a holding fork included in the carrying arm of the substrate carrying mechanism in the first embodiment of the present embodiment.
Figure 8:
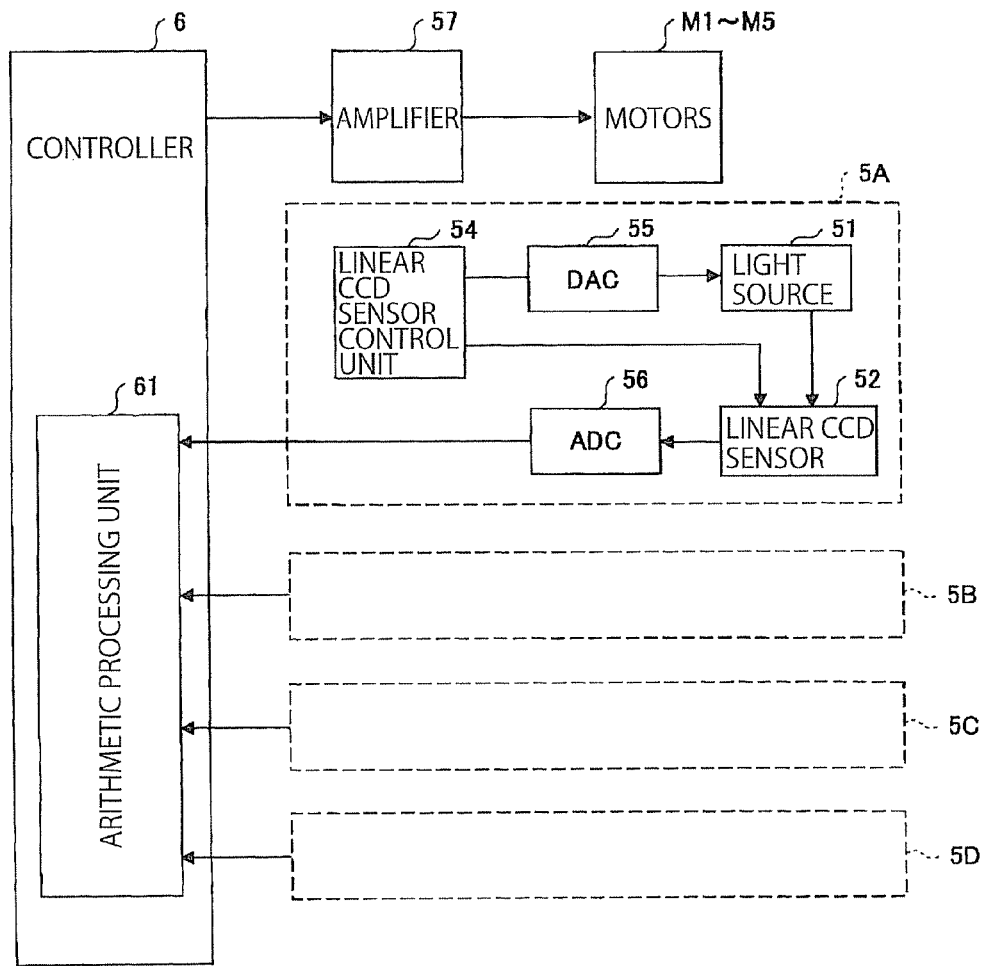
FIG. 8 is a block diagram of detecting units and a controller.
Figure 11:
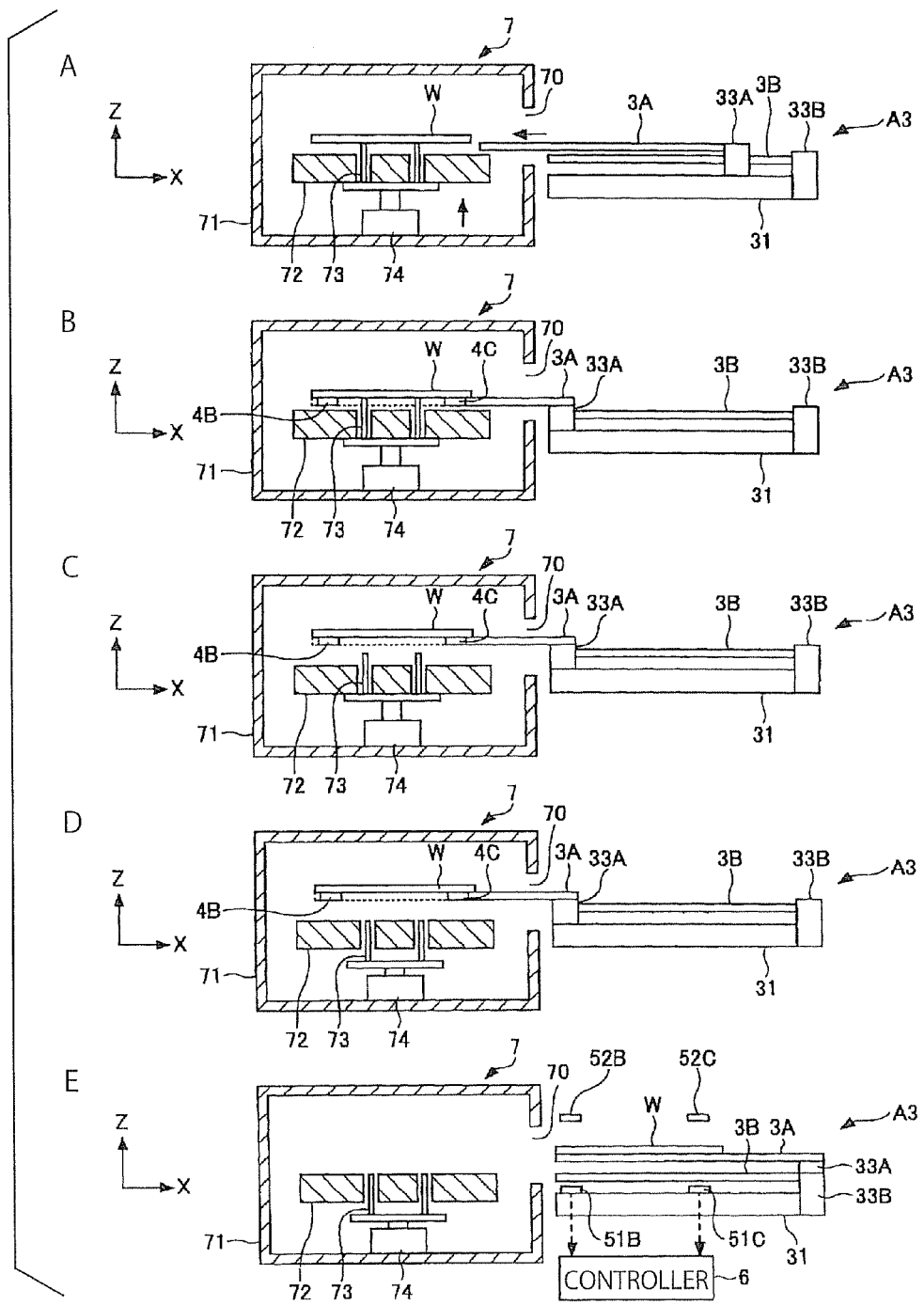
FIGS. 11A to 11E are schematic side elevations of a heating module and the carrying arm in a wafer transfer operation.

The holding forks 3 and the detecting units 5 will be described with reference to FIGS. 5 to 8. FIG. 7 is an enlarged plan view of the holding fork 3A, in which holding protrusions 4 (4A to 4D) are enlarged relative to the holding fork 3A to facilitate illustration. FIG. 8 is a block diagram of the detecting units 5 and the controller 6. The controller 6 shown in FIG. 8 is identical with the controller 6 illustrated in FIGS. 9 and 11.

Referring to FIGS. 5 to 7, the holding forks 3A and 3B are formed in a generally circular shape so as to surround a wafer W. The holding protrusions 4 protrude radially inward from the inner surface of the holding fork 3A (3B) and are arranged at equal circumferential intervals. A wafer W is held on the holding fork 3A (3B) with parts of the edge thereof seated on the holding protrusions 4. The number of the holding protrusions 4 is three or greater. The holding fork 3A (3B) shown in FIGS. 5 and 6 is provided with four holding protrusions 4A, 4B, 4C and 4D to hold the wafer W by the four parts of the edge.

Referring to FIGS. 5 to 7, the holding protrusions 4A to 4D are provided with suction parts 41A to 41D, respectively. When parts of the edge of the wafer W are seated on the holding protrusions 4A to 4D, the suction parts 41A to 41D attract the parts of the edge by vacuum suction to hold the wafer W on the holding protrusions 4A to 4D. As shown in FIG. 7, the suction parts 41A to 41D has suction holes 42A to 42D formed in the holding protrusions 4A to 4D, respectively. As shown in FIG. 6A, the suction holes 42A to 42D connect to vacuum pipes 43A and 43B of the holding forks 3A and 3B, respectively. The vacuum pipe 43A (43B) is extended inside, the upper surface or the lower surface of the holding fork 3A (3B) and is connected to a vacuum exhaust unit, not shown. The vacuum suction parts 41A to 41D thus formed can attract a wafer W by vacuum suction.

The holding fork 3A (3B) holds a wafer W on the holding protrusions 4A to 4D by the suction parts 41A to 41D. Therefore, the holding fork 3A (3B) does not need any guide structure provided with a guide wall having a downward tapered inner surface and capable of surrounding a wafer W to guide the wafer W to a predetermined position. Therefore, when a wafer W coated with a coating film, such as a resist film, is placed on the holding fork 3A (3B), there is no possibility that the coating film coating the edge of the wafer W is abraded by the guide to produce particles.

This embodiment can accurately measure a positional error of a wafer W on the holding fork 3A (3B) and can readily correct the positional error. Therefore, the holding fork 3A (3B) may be provided with a simple support structure instead of the guide structure and does not necessarily need the suction parts.

Referring to FIGS. 5 to 7, the number of the detecting units 5 (5A to 5D) is four. When the holding fork 3A (3B) holding a wafer W is retracted, the detecting units 5 (5A to 5D) detect positions of different parts of the edge of the wafer W, respectively. When the holding fork 3A (3B) is retracted, the detecting units 5 (5A to 5D) coincide with parts of the edge of a wafer W held by the holding fork 3A (3B) in a plane. The detecting units 5 (5A to 5D) are arranged at angular intervals on a circle corresponding to the edge of a wafer W held by the retracted holding fork 3A (3B).

Each detecting unit 5 (5A, 5B, 5C or 5D) includes a light source 51 (51A, 51B, 51C or 51D) and a photodetector 52 formed by arranging a plurality of light-sensing elements. The photodetector 52 may be, for example, a linear image sensor 52 (52A, 52B, 52C or 52D). The light source 51 (51A, 51B, 51C or 51D) and the linear image sensor 52 (52A, 52B, 52C or 52D) are disposed opposite to each other on the opposite sides, respectively, of the wafer W held by the retracted holding fork 3A (3B). The detecting units 5A to 5D detect parts of the edge of the wafer W held by the retracted holding fork 3A (3B).

More concretely, either the light source 51 (51A to 51D) or the linear image sensor 52 (52A to 52D) is disposed below the two holding forks 3A and 3B and the other is disposed above the same. When the light source 51 (51A to 51D) or the linear image sensor 52 (52A to 52D) is disposed below the two holding forks 3A and 3B, the light source 51 (51A to 51D) or the linear image sensor 52 (52A to 52D) may be attached to the base 31 or may be attached to the side of the lower holding fork 3B on the side of the base 31. When the light source 51 (51A to 51D) or the linear image sensor 52 (52A to 52D) is disposed above the two holding forks 3A and 3B, the linear image sensor 52 (52A to 52D) or the linear image sensor may be attached to the base 31 or may be attached to the side of the upper holding fork 3A not facing the base 31.

In the case shown in FIGS. 5 and 6, the light sources 51 are attached to the base 31 and the linear image sensors 52 are attached to the support member 53 held on the base 31.

Since the detecting units 5 are thus constructed, the light sources 51 and the linear image sensors 52 can be used for detecting the positions of parts of the edge of the wafer W held by either of the holding arms 3A and 3B. Therefore, the respective numbers of the light sources 51 and the linear image sensors 52 for each of the carrying arms A1 to A4 are not large.

Four detecting units 5 may be used for each of the two holding forks 3A and 3B. When four detecting units 5 are used for each of the two holding forks 3A and 3B, the light sources 51 and the linear image sensors 52 of each detecting unit 5 for the holding fork 3A (3B) are disposed on the opposite sides, respectively, of a wafer W held by the retracted holding fork 3A (3B).

Since the four detecting units 5 (5A to 5D) are used, a positional error of a wafer W provided with a notch WN in its edge can be accurately detected in carrying the wafer W and the positional error can be readily corrected. The number of the detecting units 5 in each of the carrying arms A1 to A4 may be greater than four.

The light source 51 will be described on an assumption that the light source 51 is provided with an LED (light-emitting diode) or LEDs. More concretely, the light source may be a linear light source provided with a plurality of LEDs arranged on a straight line or may be a linear light source provided with a single LED and a linear light-conducting member. The linear image sensor 52 may be any one of linear image sensors, such as linear CCD sensors (linear charge-coupled device sensors), linear fiber sensors, photoelectric sensors and such. Image sensing elements of the linear image sensor 52 may be CCDs, photoelectric sensors or such. In the following description, the linear image sensors 52 are supposed to be linear CCD sensors.

As shown in FIG. 8, the detecting unit 5A has the light source 51, the linear CCD sensor 52, a linear CCD sensor control unit 54, a digital-to-analog converter (DAC) 55, and an analog-to-digital converter (ADC) 56. The detecting units 5B, 5C and 5D, not shown in FIG. 8, have the same configuration as the detecting unit 5A.

The linear CCD sensor control unit 54 shifts operating times of the CCDs of the linear CCD sensor 52 according to a clock signal generated by a clock, not shown, to move signal charges sequentially from element to element. The linear CCD sensor control unit 54 is a timing signal generator also. The linear CCD sensor control unit 54 controls current to the light source 51 also. The DAC 55 converts a digital control signal generated by the linear CCD sensor control unit 54 into an analog signal to be given to the light source 51. The ADC 56 converts an analog signal, namely, a detection signal, generated by the linear CCD sensor 52 into a digital signal to be provided by the detecting unit 5A The detecting unit 5 gives the detection signal conveying a detected value to the controller 6. The controller 6 controls, through an amplifier 57, five motors for five-axis driving, namely, X-axis drive motors M1 and M2 included in the linear drive mechanisms 33A and 33B, a Y-axis drive motor M3 installed in the base 31, a Z-axis drive motor M4 installed on the lifting table 34, and a rotational drive motor M5 included in the turning mechanism 32.

The DAC 55 converts a control signal provided by the linear CCD sensor control unit 54 into an analog control signal and gives the analog control signal to the light source 51, and then the light source 51 shines in a bright line. The linear CCD sensor 52 receives light emitted by the light source 51. Charges in the linear CCD sensor 52 are moved sequentially at times according to a control signal provided by the linear CCD sensor control unit 54. Then, the linear CCD sensor 52 generates a signal conveying an amount of light received by the linear CCD sensor 52 when charges are moved. An output detection signal conveying a detected value provided by the linear CCD sensor 52 is converted into a digital detection signal by the ADC 56, and then, the digital detection signal is given to an arithmetic processing unit 61 included in the controller 6.

The controller 6 including the arithmetic processing unit 61 measures the position of the edge of the wafer W on the basis of the digital detection signal, calculates the position of the center of the wafer W, calculates the radius of the wafer W, and decides whether or not none of the four detecting units 5A to 5D detected a notch WN formed in the wafer W. If it is decided that one of the four detecting unit 5A to 5D detected the notch WN, the position of the holding fork 3A or 3B is corrected on the basis of detected values detected by the three detecting units 5 excluding the detecting unit that detected the notch WN.

Operations of the controller 6 for controlling a transfer operation for transferring a wafer W between the carrying arm and the processing module will be described with reference to FIG. 9.

A substrate carrying method will be described in connection with a heating module 7 as a processing module to which the carrying arm transfers and from which the carrying arms receives a wafer W. Heating modules 7, as mentioned with reference to FIGS. 3 and 4, are components of the shelf units U3 of the first processing unit (DEV layer) B1, the second processing unit (BCT layer) B2, the third processing unit (COT layer) B3 and the fourth processing unit (TCT layer) B4.

FIG. 9 shows the controller 6 in connection with the carrying arm A3 and the heating module 7 of the third processing unit (COT layer) B3.

As shown in FIG. 9, the heating module 7 processes a wafer W by a heating process. A hot plate 72 is disposed in a processing vessel 71. The hot plate 72 is provided with lifting pins 73. A lifting mechanism 74 moves the lifting pins 73 vertically. Indicated at 70 in FIG. 9 is a transfer opening through which a wafer W is carried into and out of the processing vessel 71.

The controller 6 has the arithmetic processing unit 61, a storage device 62, a display 63 and an alarm generator 64.

The arithmetic processing unit 61 is a computer including, for example, a memory and a CPU (central processing unit). The arithmetic processing unit 61 reads a program stored in the storage device 62, sends control signals according to instructions included in the program to the components of the resist pattern forming system to make the resist pattern forming system execute resist pattern forming processes. The arithmetic processing unit 61 reads a program stored in the storage device 62, and sends control signals to the motors M1 to M5 of the carrying arm A3 according to instructions included in the program to execute transfer operations for transferring a wafer W and carrying operations for carrying a wafer W.

The storage device 62 is a computer-adaptive storage medium storing programs to be executed by the arithmetic processing unit 61. The storage medium may be, for example, a flexible disk, a compact disk, a hard disk or a magneto-optical disk (MO disk).

The display 63 is, for example, a screen combined with a computer. Operations for selecting substrate processing processes and for entering parameters of the substrate processing processes can be achieved by operating the display 63.

The alarm generator 64 generates an alarm when a trouble occurs in the components of the resist pattern forming system including the carrying arm A3.

As mentioned above, the arithmetic processing unit 61 sends predetermined control signals to the linear drive mechanisms 33A and 33B of the carrying arm A3, the motors M1 to M5 on the base 31, the lifting table 34 and the turning mechanism 32, the encoder 38 and the counter 39 to control the same. A program to be executed to carry out a substrate carrying method of the present embodiment is stored in the storage device 62.

Figure 10:
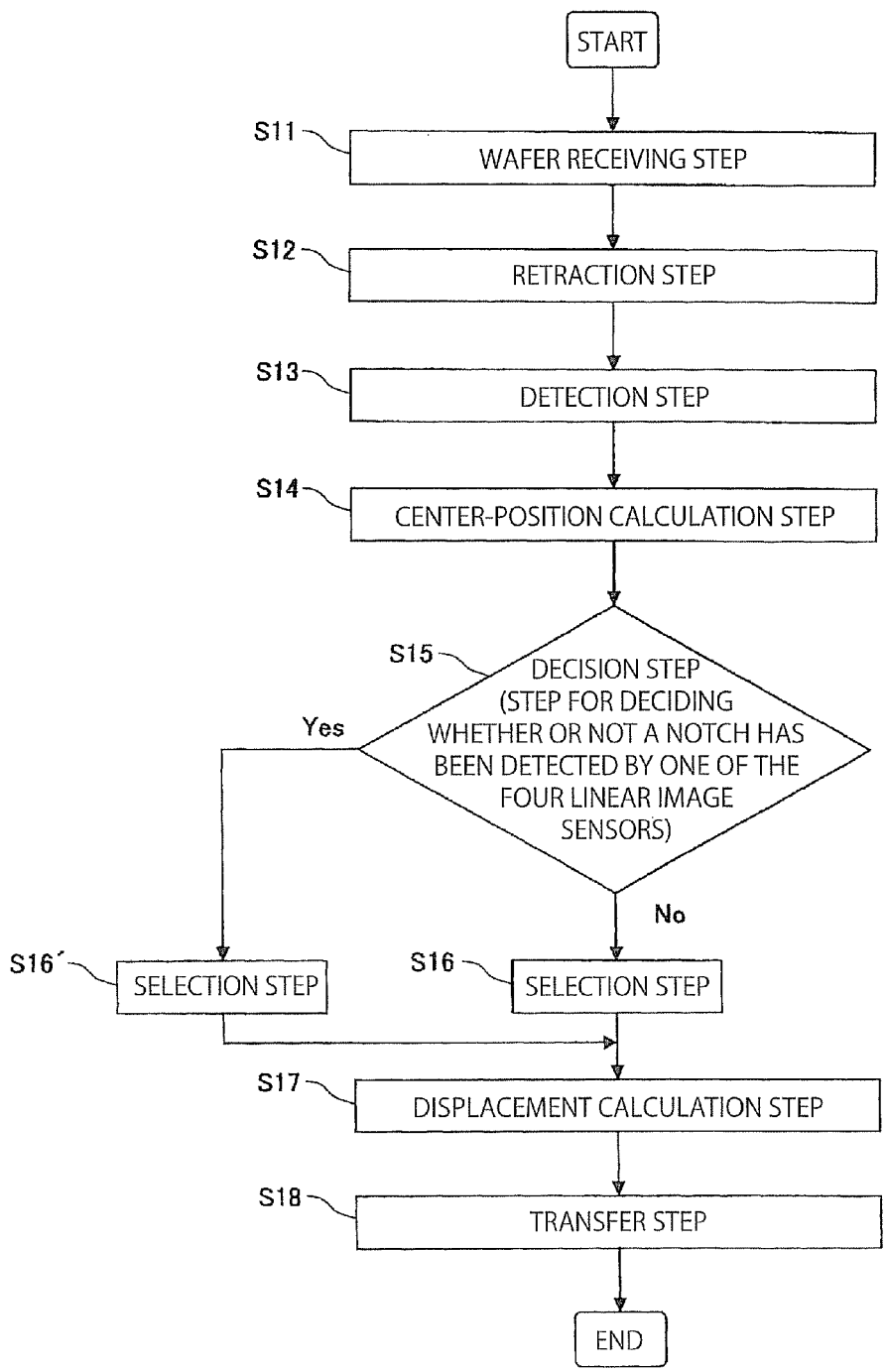
FIG. 10 is a flow chart showing a substrate carrying method.
Figure 12:
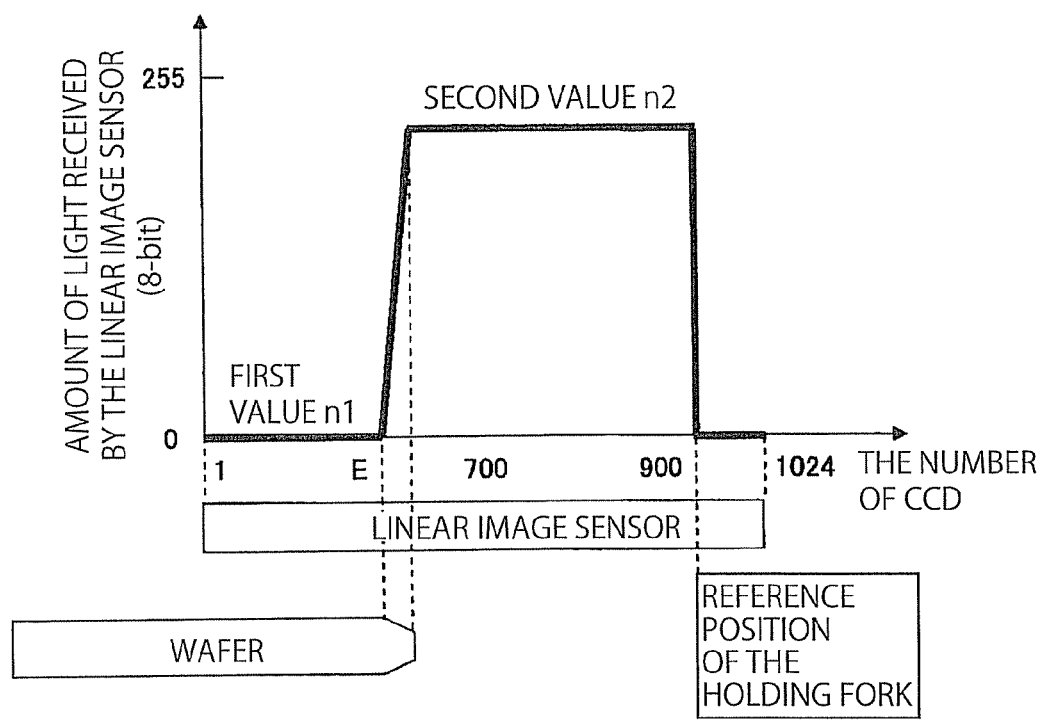
FIG. 12 is a graph typically showing the amounts of received light respectively received by image sensing elements of a linear image sensor.
Figure 13:
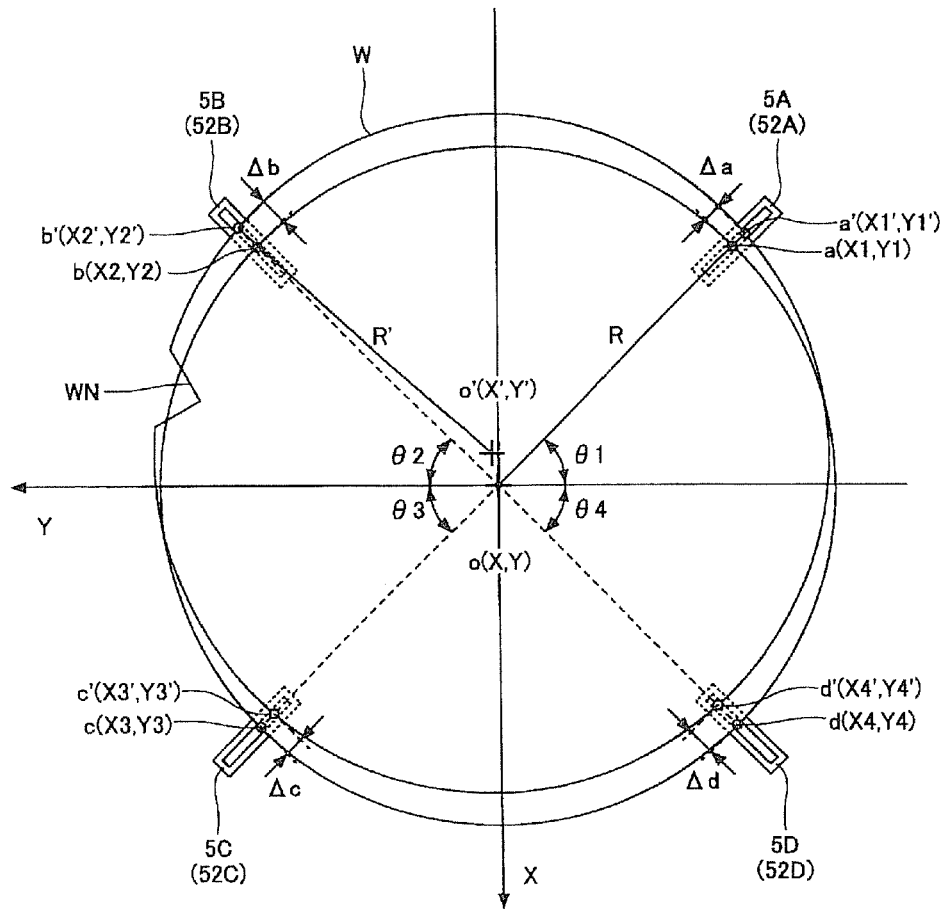
FIG. 13 is a plan view of a wafer and four linear image sensors in a state in which none of the linear image sensors have detected a notch formed in the wafer.
Figure 14:
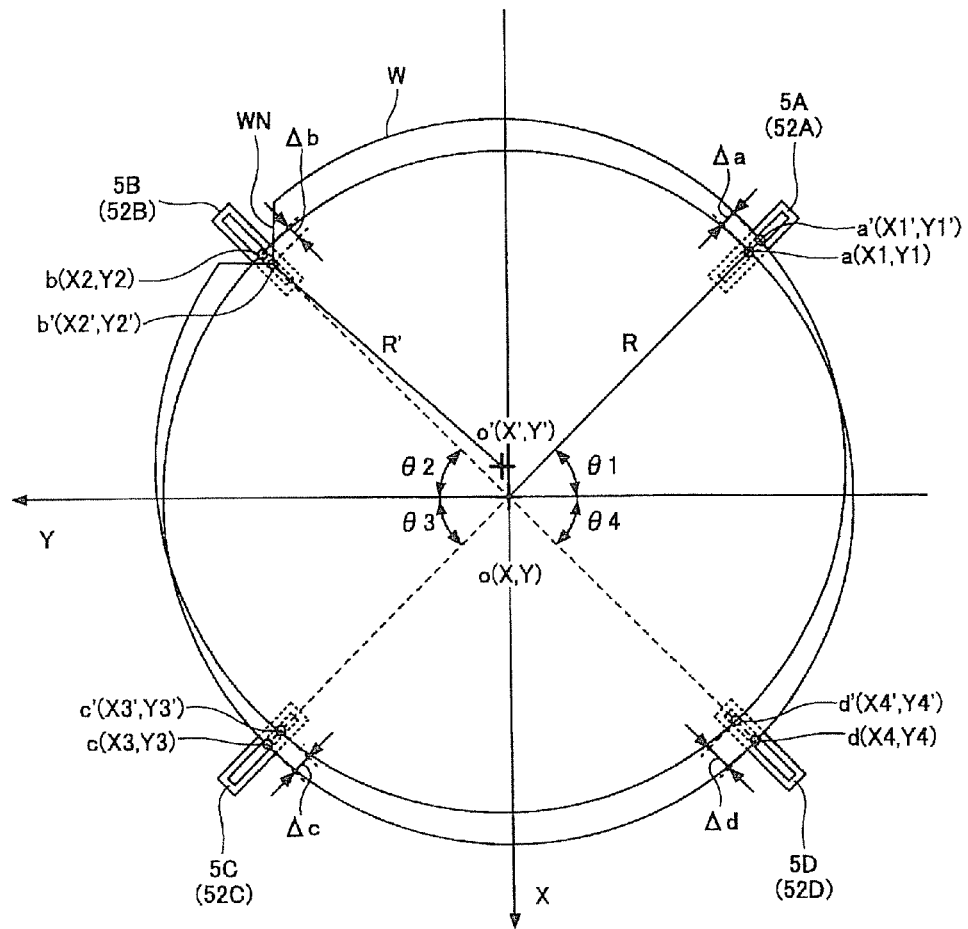
FIG. 14 is a plan view of a wafer and four linear image sensors in a state in which a notch formed in the wafer has been detected by one of the linear image sensors.

Steps of the substrate carrying method in this embodiment, by which the holding fork 3A of the carrying arm A3 receives a wafer W from the heating module 7 will be described by way of example with reference to FIGS. 9 to 14. FIG. 10 is a flow chart showing steps of the substrate carrying method. FIGS. 11A to 11E are drawings of assistance in explaining operations of the heating module 7 and the carrying arm A3 for transferring a wafer W from the heating module 7 to the carrying arm A3. FIG. 12 is a graph typically showing the amounts of light received respectively by the image sensing elements of the linear image sensor. FIG. 13 is a plan view of a wafer W and the four linear image sensors 52A to 52D in a state in which none of the linear image sensors 52A to 52D have detected a notch WN formed in the wafer W. FIG. 14 is a plan view of a wafer W and the four linear image sensors 52A to 52D in a state in which the linear image sensor 52B has detected a notch WN formed in the wafer W.

As shown in FIG. 10, the substrate carrying method has a reception step (step S11), a retraction step (step S12), a detection step (step S13), a center-position calculation step (step S14), a decision step (step S15), a selection step (step S16 or step S16'), a displacement calculation step (step S17) and a transfer step (step S18)

In the reception step (step S11), the lifting pins 73 supporting a wafer W are raised to lift up the wafer W above the hot plate 72 by the lifting pins 73 as shown in FIG. 11A. Then, the holding fork 3A is advanced from its home position along the X-axis into a space under the wafer W as shown in FIG. 11B. Then, the holding fork 3A is raised as shown in FIG. 11C to receive the wafer W from the hot plate 72 of the heating module 7 by picking up the wafer W from the lifting pins 73 and holding the wafer W by the holding protrusions 4A to 4D.

In the retraction step (step S12) shown in FIG. 11D, the lifting pins 73 are lowered after the wafer W has been held by the holding fork 3A. Then, the holding fork 3A is retracted along the X-axis from the heating module 7 to the home position as shown in FIG. 11E.

In the detection step (step S12), the controller 6 calculates the position of the edge of the wafer W on the bases of values detected by he linear image sensors 52 after the holding fork 3A holding the wafer W has been retracted as shown in FIG. 11E.

The light sources 51 below the holding fork 3A emit light upward after the holding form 3A holding the wafer W has been retracted to the home position in the retraction step (step S12). The linear image sensors 52 disposed above the holding arm 3A retracted to the home position receive the light emitted by the light source 51. When the linear image sensors are linear CCD sensors each provided with CCDs, namely, image sensing devices, linearly arranged parallel to a diameter of the wafer W, the boundary between the CCDs that received the light and those not received the light can be determined on the basis of values measured by the CCDs. The boundary corresponds to a part of the edge of the wafer W. Thus, the horizontal position of the part of the edge of the wafer W can be measured.

Referring to FIG. 12, a first value n1 is a value detected (hereinafter, referred to as "amount of light received") by the CCDs not received the light emitted by the light source 51 and a second value n2 is an amount of light detected by the CCDs received the light emitted by the light source 51. A position E at the boundary of the first value n1 and the second value n2 corresponds to a part of the edge of the wafer W. When the amount of light received is converted to 8-bit data, the first value n1 can be, for example, 0 and the second value n2 can be, for example, a predetermined value not greater than 255. In FIG. 12, the number of the CCD at a reference position where the light emitted by the light source 51 is shaded by the holding fork 3A (3B) is 900, which will be described later with reference to FIG. 15.

As mentioned above, the LED serving as the light source 51 may be replaced by one of various kinds of light sources. Each of the CCDs of the linear image sensor 52 may be replaced by any of various kinds of light-receiving elements.

As shown in FIG. 13, an angle between a direction in which the linear image sensor 52A is extended and the Y-axis, an angle between a direction in which the linear image sensor 52B is extended and the Y-axis, an angle between a direction in which the linear image sensor 52C is extended and the Y-axis and an angle between a direction in which the linear image sensor 52D is extended and the Y-axis are angles θ1, θ2, θ3 and θ4, respectively.

When a wafer W is held correctly by the holding fork 3A, the wafer W is at a reference position, namely, a predetermined position as mentioned in this specification. As shown in FIG. 13, points a, b, c and d are those on the linear image sensors 52 corresponding to parts of the edge of the wafer W above the linear image sensors 52 when the wafer W is held at the reference position and points a', b', c' and d' are those on the linear image sensors 52 corresponding to the parts of the edge of the wafer W above the linear image sensors 52 when the wafer W is held by the holding fork 3A and is displaced from the reference position.

Suppose that Δa, Δb, Δc and Δd are distances between the points a and a', between the points b and b', between the points c and c' and between the points d and d', respectively. The distances Δa, Δb, Δc and Δd are expressed by Expressions (1), (2), (3) and (4).

$$\Delta a = \{(\text{Number of CCD at point } a') - (\text{Number of CCD at point } a)\} \times \text{Pitch of CCDs (mm)} \quad (1)$$

$$\Delta b = \{(\text{Number of CCD at point } b') - (\text{Number of CCD at point } b)\} \times \text{Pitch of CCDs (mm)} \quad (2)$$

$$\Delta c = \{(\text{Number of CCD at point } c') - (\text{Number of CCD at point } c)\} \times \text{Pitch of CCDs (mm)} \quad (3)$$

$$\Delta d = \{(\text{Number of CCD at point } d') - (\text{Number of CCD at point } d)\} \times \text{Pitch of CCDs (mm)} \quad (4)$$

The respective positions of the points a to d and the points a' to d' are indicated by coordinates expressed by Expressions (5) to (12)

$$\text{Point } a(X1, Y1) = (X - R\sin\theta 1, Y - R\cos\theta 1) \quad (5)$$

$$\text{Point } a'(X1', Y1') = (X1 - \Delta a\sin\theta 1, Y1 - \Delta a\cos\theta 1) \quad (6)$$
$$= (X - (R + \Delta a)\sin\theta 1, Y - (R + \Delta a)\cos\theta 1)$$

$$\text{Point } b(X2, Y2) = (X - R\sin\theta 2, Y + R\cos\theta 2) \quad (7)$$

$$\text{Point } b'(X2', Y2') = (X2 - \Delta b\sin\theta 2, Y2 + \Delta b\cos\theta 2) \quad (8)$$
$$= (X - (R + \Delta b)\sin\theta 2, Y + (R + \Delta b)\cos\theta 2)$$

$$\text{Point } c(X3, Y3) = (X + R\sin\theta 3, Y + R\cos\theta 3) \quad (9)$$

$$\text{Point } c'(X3', Y3') = (X3 + \Delta c\sin\theta 3, Y3 + \Delta c\cos\theta 3) \quad (10)$$
$$= (X + (R + \Delta c)\sin\theta 3, Y + (R + \Delta c)\cos\theta 3)$$

$$\text{Point } d(X4, Y4) = (X + R\sin\theta 4, Y - R\cos\theta 4) \quad (11)$$

$$\text{Point } d'(X4', Y4') = (X4 + \Delta d\sin\theta 4, Y4 - \Delta d\cos\theta 4) \quad (12)$$
$$= (X + (R + \Delta d)\sin\theta 4, Y - (R - \Delta d)\cos\theta 4)$$

The respective coordinates (X1', Y1'), (X2', Y2'), (X3', Y3') and (X4', Y4') of the points a', b', c' and d' can be calculated by using Expressions (6), (8), (10) and (12).

In the center-position calculation step (step S14), the coordinates (X', Y') of the center position o', namely, the position of the center of the displaced wafer W, are calculated using the coordinates of the three points out of the four points a', b', c' and d'.

For example, the center position o' of the center of the displaced wafer W is calculated by substituting the respective coordinates (X1', Y1'), (X2', Y2'), (X3', Y3') of the points a', b' and c' into Expression (13) and (14).

$$X' = \frac{X1'^2(Y3' - Y2') + X2'^2(Y1' - Y3') + X3'^2(Y2' - Y1') - (Y1' - Y3')(Y3' - Y2')(Y2' - Y1')}{2\left\{\begin{array}{c} X1'(Y3' - Y2') + X2'(Y1' - Y3') + \\ X3'(Y2' - Y1') \end{array}\right\}} \quad \text{Expression (13)}$$

$$Y' = \frac{Y1'^2(X2' - X3') + Y2'^2(X3' - X1') + Y3'^2(X1' - X2') - (X2' - X3')(X3' - X1')(X1' - X2')}{2\left\{\begin{array}{c} Y1'(X2' - X3') + Y2'(X3' - X1') + \\ Y3'(X1' - X2') \end{array}\right\}} \quad \text{Expression (14)}$$

A radius R' is calculated by substituting the respective coordinates (X1', Y1'), (X2', Y2'), (X3', Y3') and (X', Y') of the points a', b' and c' and the center position o' into Expression (15).

$$R' = \sqrt{\{(X' - X1')^2 + (Y' - Y1')^2\}} \quad \text{Expression (15)}$$

In the center-position calculation step (step S14), the coordinates (X', Y') of the center o' of the displaced wafer W are calculated by using the coordinates of combinations each of three points, such as a combination of points a', b' and d', a combination of points a', c' and d' and a combination of points b', c' and d', excluding the combination of the points a', b' and c') for use in the following decision step (step S15).

In the decision step (step S15), a decision is made as to whether or not the notch WN in the edge of the wafer W has been detected by any one of the four linear image sensors 52A to 52D.

The coordinates (X', Y') of the center o' calculated by using the coordinates of the three points out of the four points a', b', c' and d', and the radius R' calculated in the center-position calculation step (step S14) are examined.

A decision is made as to whether or not the radius R' calculated by the coordinates of the combination of the three points out of the four points is substantially equal to the known radius R of the wafer W.

When the notch WN of the wafer W is not near any one of the points a', b', c' and d' in a plane as shown in FIG. 13, the radius R' calculated by using the coordinates of any three points out of the points a', b', c' and d' is substantially equal to the radius R. When the radius R' is substantially equal to the radius R, it is decided that the notch WN is not detected by any one of the four linear image sensors 52A to 52D.

In such a case, detected values detected by the three linear image sensors 52 out of the four image sensors 52A to 52D may be selected in the selection step (step S16).

When the notch WN of the wafer W is near one of the points a', b', c' and d' in a plane as shown in FIG. 14, the radius R' calculated by using the coordinates of the three points out of the four points a', b', c' and d' excluding the point near the notch WN is substantially equal to the radius R as shown in FIG. 14, and the radius R' calculated by using the coordinates of the three points including the point near the notch WN is not equal to the radius R. In this case, it is decided that the notch WN of the wafer W is detected by one of the four linear image sensors 52A to 52D. In FIG. 14, the notch WN of the wafer W is near the point b' in a plane.

In this case, detected values detected by the three linear image sensors 52 excluding the linear image sensor 52 detected the notch WN of the wafer W are selected. In the case shown in FIG. 14, the detected values detected by the three linear image sensors 52A, 52C and 52D are selected.

In the displacement calculation step (step S17), displacements ΔX and ΔY, namely, the differences between the calculated coordinates (X', Y') of the center o' and the coordinates (X, Y) of the reference position o are calculated.

Displacements ΔX and ΔY are calculated by using detected values detected by the linear image sensors, namely, the linear image sensors 52A, 52C and 52D in FIG. 14, excluding the linear image sensor detected the notch WN of the wafer W, namely, the linear image sensor 52B in FIG. 14. Expressions (16) and (17) are used.

$$\Delta X = X' - X \quad (16)$$

$$\Delta Y = Y' - Y \quad (17)$$

In the transfer step (step S18), carrying distances with respect to the X-axis and the Y-axis by which the holding fork carries the wafer W to the next processing module are adjusted by the displacements ΔX and ΔY calculated in the displacement calculation step (step S17) such that the wafer W is placed at a proper transfer position in the next processing module. In the transfer step (step S18), the transfer position in the next processing module is corrected such that the calculated center o' coincides with the reference position o. After the transfer step (step S18) has been completed, the wafer W is transferred to the substrate holding device of a succeeding processing module.

The succeeding processing module corresponds to the succeeding processing unit of the present embodiment.

This embodiment can accurately detect the displacement of a wafer W provided with a notch WN in its edge by the decision step (step S15) when the wafer W is held and carried, and a positional error of the displaced wafer W can be readily corrected. Even in a case where a wafer W is carried by the holding fork not provided with the guide structure, the displacement of the wafer W can be correctly measured and a positional error of the wafer W corresponding to the displacement can be readily corrected.

The detection step (step S13), the center-position calculation step (step S14) and the displacement calculation step (step S17) may be executed after the wafer W has been carried to the succeeding processing module to detect a displacement of the wafer W caused while the wafer W is being carried to the succeeding processing module.

This embodiment can detect various abnormal states by using detected values, i.e., amounts of light, measured by the CCDs of the linear CCD sensors 52. Methods of detecting the abnormal bend of the holding fork 3A (3B), an abnormal state of a wafer W, an abnormal state of the light source 51 and an abnormal state of the linear CCD sensor 52 will be described.

Figure 15:
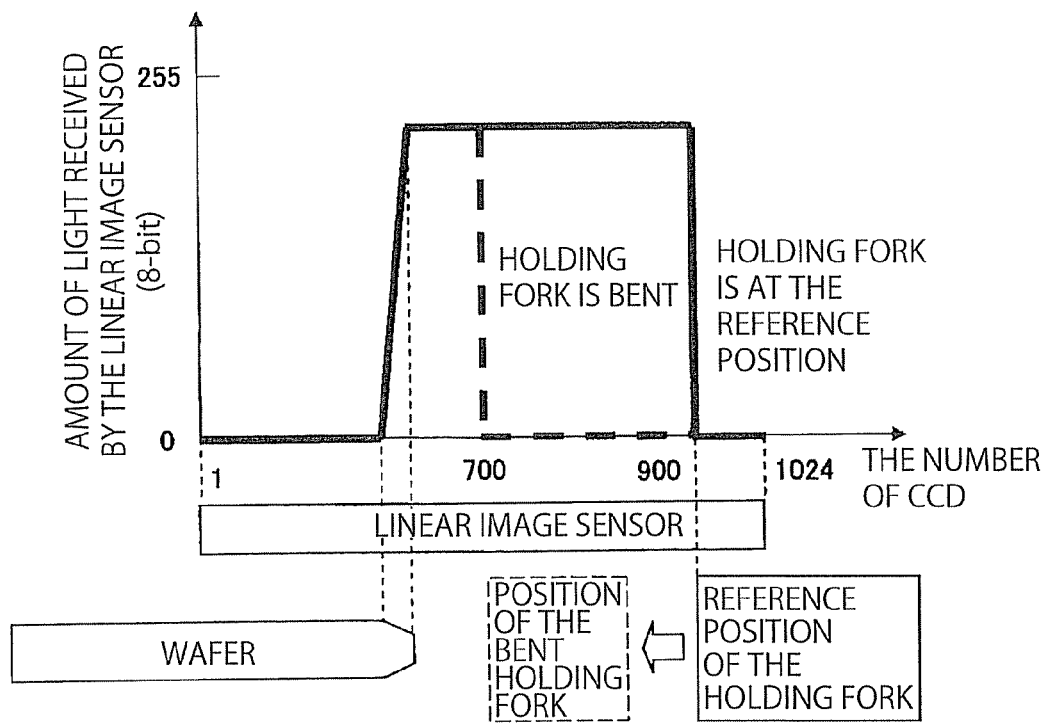
FIG. 15 is a graph of assistance in explaining making a decision that a holding fork is abnormally bent, typically showing the amounts of received light respectively received by image sensing elements of a linear image sensor.

The method of detecting the bend of the holding fork 3A (3B) will be described with reference to FIG. 15 typically showing the relation between the numbers of the CCDs and the amounts of light received.

When the detecting unit 5 is separated from the holding forks 3A (3B), part of light emitted by the light source 51 is shaded by the holding forks 3A (3B). Detected values provided by the linear CCD sensors 52 when the partly shaded light is received by the linear CCD sensors 52 are stored beforehand. The shape of the holding forks 3A (3B) can be periodically monitored on the basis of a measured value provided by the linear CCD sensors 52 when the holding fork 3A (3B) is retracted. The detecting unit 5 is designed such that the position of the holding fork 3A (3B) at different positions can be detected when the holding forks 3A (3B) is retracted.

More concretely, the number of the CCD at a position where the amount of light received by the linear image sensor changes is stored as the predetermined reference position of the holding forks 3A (3B). The reference position of the holding fork 3A (3B) is a position where the shape of the holding forks 3A (3B) having a normal shape is detected when the holding forks 3A (3B) is retracted to its-the home position. For example, the number of the CCD corresponding to the reference position of the holding forks 3A (3B) is 900. If the holding fork 3A (3B) is bent due to interference between the holding fork 3A (3B) and a part of the carrying arm A3 or a part of the processing module, the number of the CCD corresponding to the reference position becomes, for example, about 700. When the number of the CCD corresponding to the reference position changes, it is decided that the holding fork 3A (3B) is bent.

When it is decided, on the basis of the change of the number of the CCD corresponding to the reference position, that the holding fork 3A (3B) is bent several millimeters and a carrying operation for carrying a wafer W can be continued by using the bent holding fork 3A (3B), the wafer W is carried in the transfer step (step S18), and controller 6 makes the alarm generator 64 generate an alarm upon the completion of the carrying operation. If it is decided that the bend of the holding fork 3A (3B) is extraordinarily large, the controller discontinues the carrying operation for carrying the wafer W and makes the alarm generator 64 generate an alarm.

The controller 6 compares a position to which the holding fork 3A (3B) holding a wafer W has been retracted with the reference position of the holding fork 3A (3B) to decide whether or not the shape of the holding fork 3A (3B) is abnormal.

Since the carrying operation can be continued when the holding fork 3A (3B) is bent slightly, the resist pattern forming system can operate at a high operating ratio. Since the position of the center of a wafer W is calculated and the bend of the carrying fork 3A (3B) is examined in every carrying cycle, breakage of the carrying fork 3A (3B) can be immediately detected.

Figure 16:
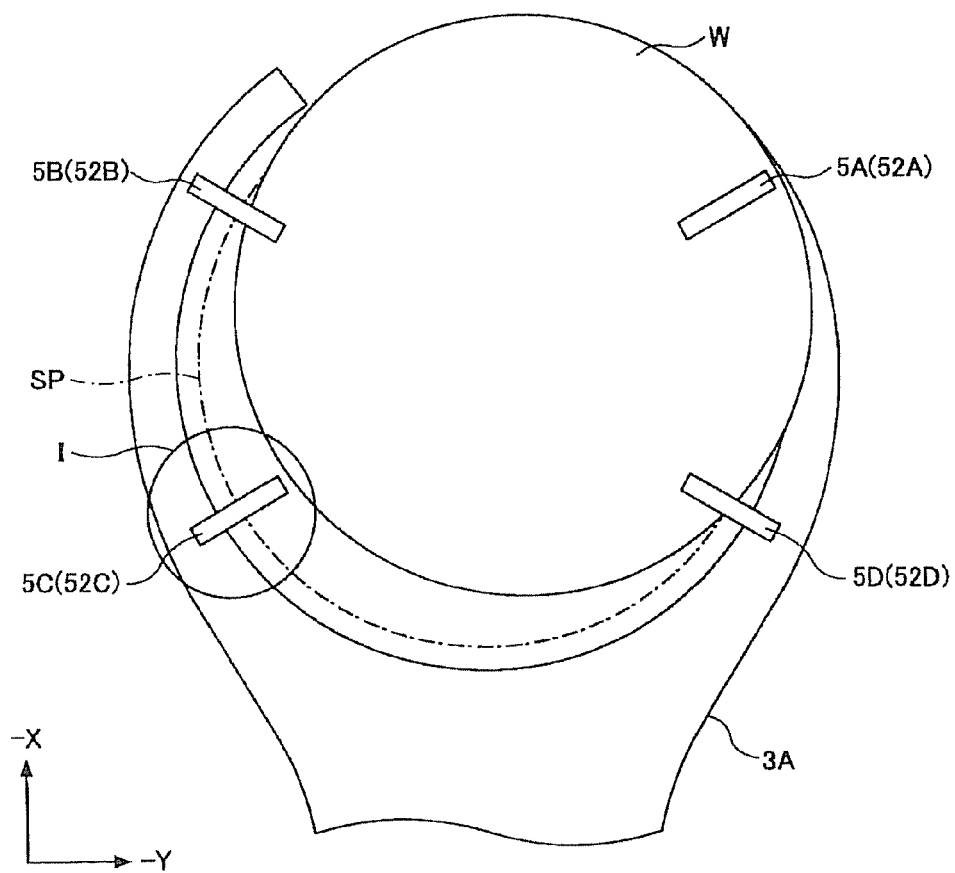
FIG. 16 is a first enlarged plan view of a holding fork holding a wafer.
Figure 17:
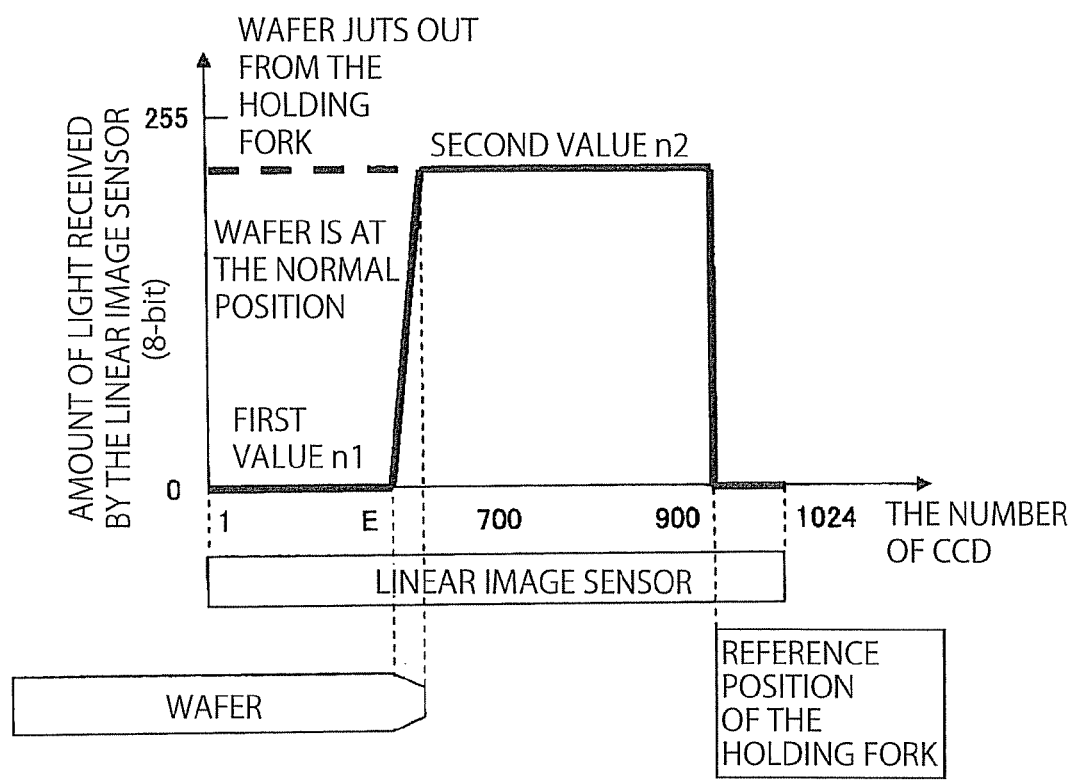
FIG. 17 is a first graph of assistance in explaining making a decision that a wafer is in an abnormal state, typically showing the relation between the amounts of light respectively received by the image sensing elements of a linear image sensor.
Figure 18:
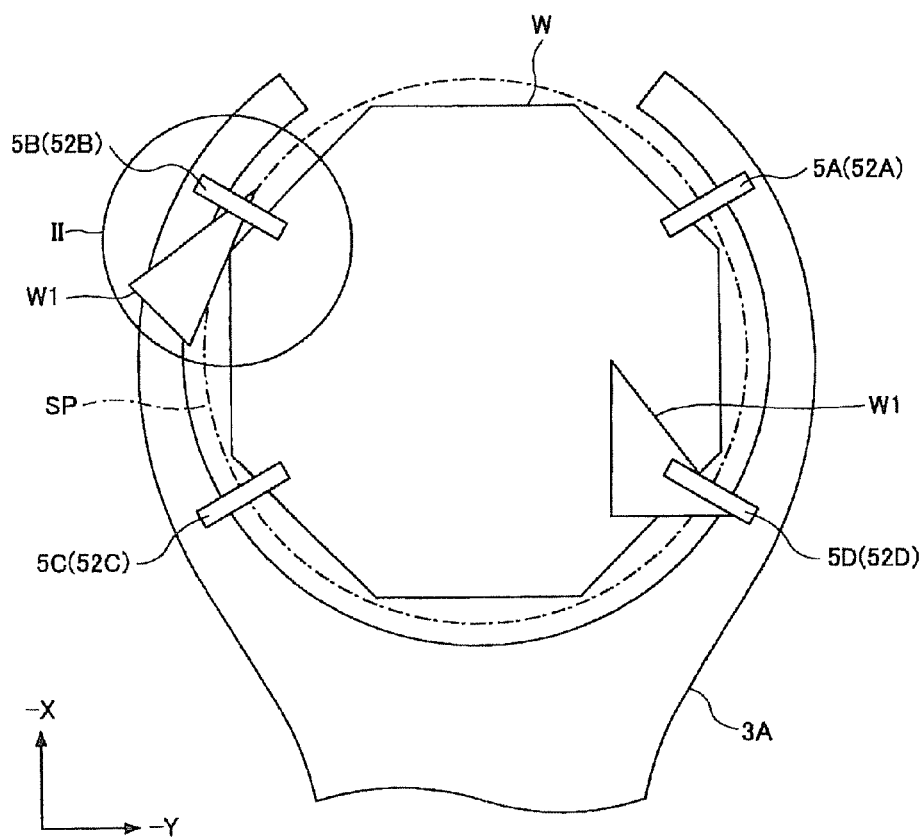
FIG. 18 is a second enlarged plan view of assistance in explaining an abnormal state of a wafer held by a holding fork.
Figure 19:
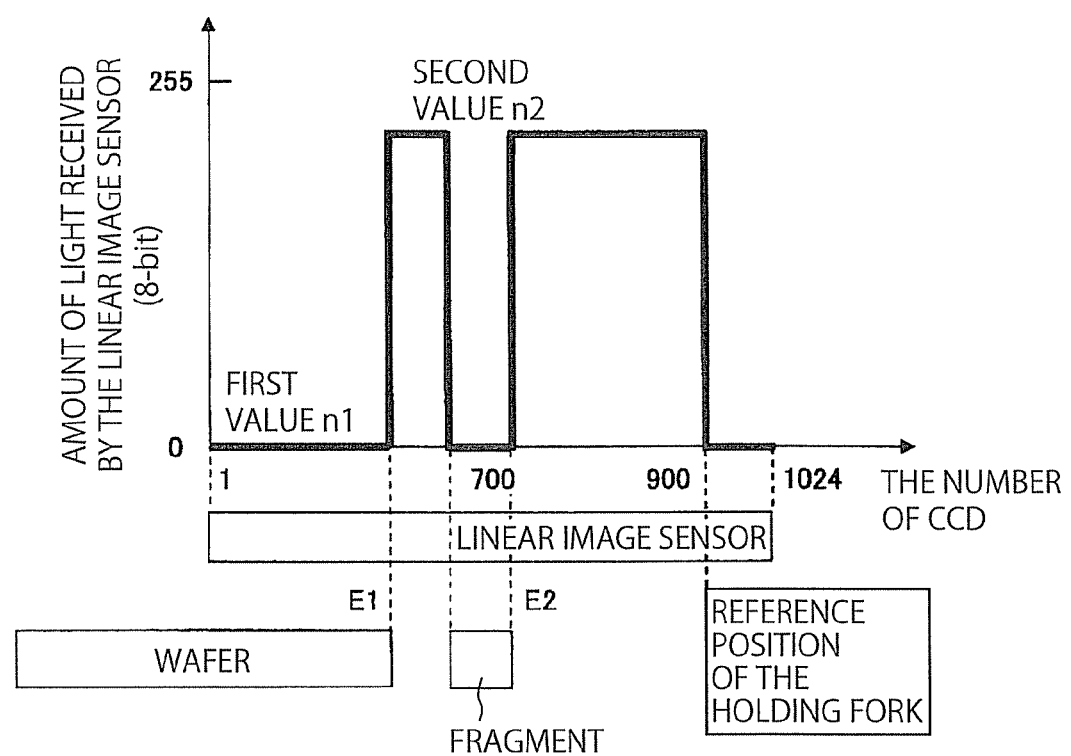
FIG. 19 is second graph of assistance in explaining making a decision that a wafer is in an abnormal state, typically showing the amounts of light respectively received by the image sensing elements of a linear image sensor.

A method of detecting an abnormal state of a wafer W will be described with reference to FIGS. 16 to 19. FIGS. 16 and 18 are enlarged plan views of the holding fork 3A holding a wafer W, in which the holding protrusions 4A, 4B, 4C and 4D and a notch WN are omitted to facilitate illustration. FIGS. 17 and 19 are views of assistance in explaining a method of deciding that the wafer W is in an abnormal state. FIGS. 17 and 19 typical show the relation between the number of the CCD of the linear image sensor 52 and the amount of light received by the CCD.

The position of the edge of the wafer W can be determined by detecting the boundary between the CCD that received the first amount n1 of light and the CCD that received the second amount n2 of light. Accordingly, a state in which a wafer W is held abnormally by the holding fork 3A (3B) can be detected from the amounts of light received by the CCDs.

Suppose that a wafer W is displaced from the reference position SP and part of the wafer W juts out from the holding fork 3A and no part of the wafer W coincides with the linear image sensor 52C in a circular area I as shown in FIG. 16. Then, the amount of light received by the CCDs of the linear image sensor 52C excluding those shaded by the holding fork 3A is the second value n2 as indicated by a broken line in FIG. 17, and the amount of light received by any one of the CCDs not shaded by the holding fork 3A is not the first value n1. Thus, when the amount of light received by the CCDs of any one of the linear image sensors 52 not shaded by the holding fork 3A is the second value n2 and the edge of the wafer W is not detected, the controller 6 decides that the wafer W juts out partly from the holding fork 3A.

Suppose that the wafer W is not at the reference position SP on the holding fork 3A and a fragment W1 in a circle II lies between the wafer W and the holding fork 3A as shown in FIG. 18. In such a case shown in FIG. 18, the amount of light received by the CCDs of the linear image sensor 52B changes from the first value n1 to the second value n2 at, for example, a position E1 and changes from the first value n1 to the second value n2 as shown in FIG. 19. Thus, the linear image sensor 52B assumes that the two different positions E1 and E2 are different parts of the edge of the wafer W. Consequently, radii R of the wafer W calculate by using detected values detected by the linear image sensors 52, respectively, are different or greatly different from the true radius of the wafer W. In such a case, the controller 6 can decide that the wafer W is broken.

When it is decided that the wafer W is jutting out partly from the holding fork 3A or the wafer W is broken from the positional change of the edge of the wafer W, the controller 6 discontinues the carrying operation for carrying the wafer W and makes the alarm generator 64 generate an alarm.

The controller 6 decides whether or not the wafer W is partly jutting out from the holding arm 3A (3B) and whether or not the wafer W is broken on the basis of detected values detected after the holding fork 3A (3B) holding the wafer W has been retracted. Since the center of a wafer W is calculated in every carrying cycle and the state of a wafer W can be decided, a wafer W partly jutting out from the holding arm 3A (3B) or a broken wafer W can be immediately detected.

Figure 20:
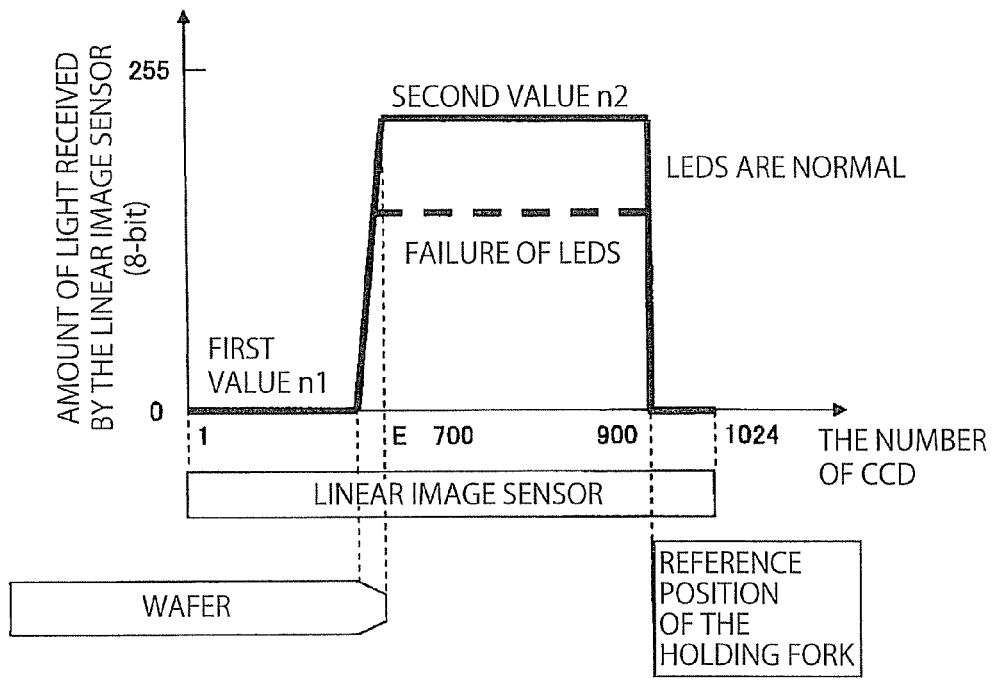
FIG. 20 is a graph of assistance in explaining making a decision that a light source is abnormal, typically showing the amounts of light respectively received by the image sensing elements of a linear image sensor.

A method of detecting a failure of the light source 51 will be described with reference to FIG. 20 typically showing the relation between the number of the CCD of the linear image sensor 52 and the amount of light received.

When the light source 51 in an abnormal state emits light, the CCDs normally not shaded by a wafer W held by the holding fork 3A receive the light. It can be decided that the light source 51 is in an abnormal state from detected values detected by those CCDs.

Suppose that the light source 51 is provided with LEDs. Possible troubles that occur in the light source 51 are, for example, burn-out of the LEDs, reduction of the luminous intensity of the LEDs, the unclean lenses combined with the LEDs and the breakage of some of cables connecting the LEDs to the controller 6.

In such a state, the amount of light received by the CCD normally not shaded by a wafer W held by the holding fork 3A changes from the second value n2 to be measured by the CCD when the light source 51 is normal. Therefore, when the amount of light received by the CCD normally not shaded by the wafer W held by the holding fork 3A (3B) is not equal to the second value n2, the controller 6 decides that a trouble occurred in the light source 51.

When the reduction of the luminous intensities of the LEDs, for example, is slight and it is decided that the carrying operation for carrying the wafer W can be continued on the basis of the change in the detected value, the carrying operation in the transfer step (step S18) is continued to carry the wafer W. The controller 6 makes the alarm generator 64 generate an alarm upon the completion of the carrying operation. If the luminous intensities of the LEDs, for example, have greatly diminished and it is decided that a failure occurred in the light source 51, the controller 6 discontinues the carrying operation for carrying the wafer W and makes the alarm generator 64 generate an alarm.

Thus, the controller 6 decides whether or not a failure occurred in the light source 51 on the basis of detected values detected by the CCDs that are not expected to be shaded from the light emitted by the light source 51 by a wafer W held by the holding fork 3A (3B).

Since the process can be continued when a failure occurred in the light source 51 is negligible, the resist pattern forming system can operate at a high operating ratio. Since the center of a wafer W is calculated and the state of the light source 51 can be examined in every carrying cycle, a failure of the light source 51 can be immediately found.

Figure 21:
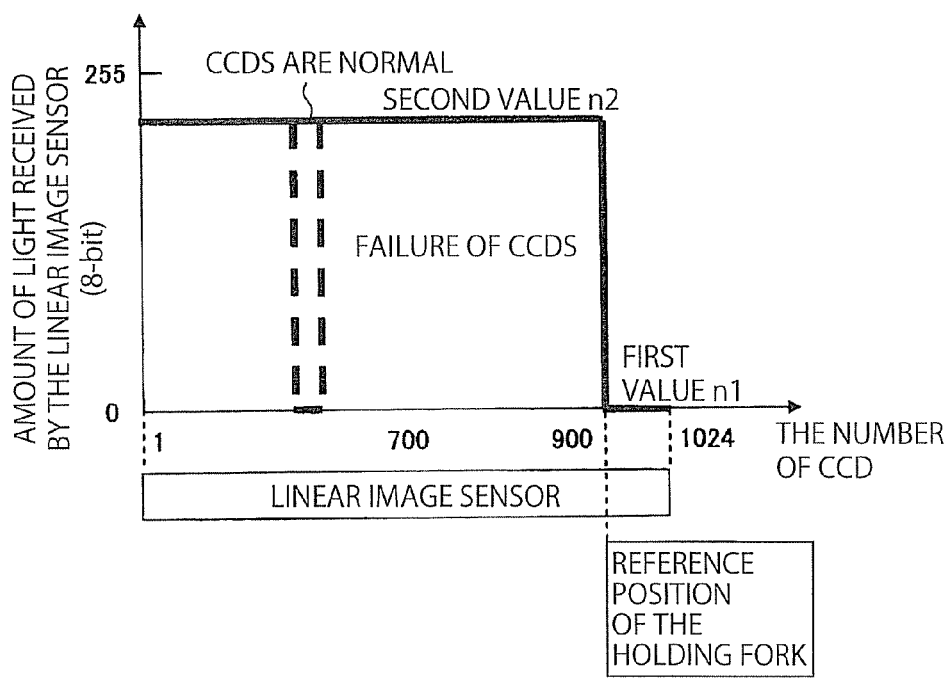
FIG. 21 is a first graph of assistance in explaining making a decision that a linear image sensor is abnormal, typically showing the amounts of light respectively received by the image sensing elements of a linear image sensor.
Figure 22:
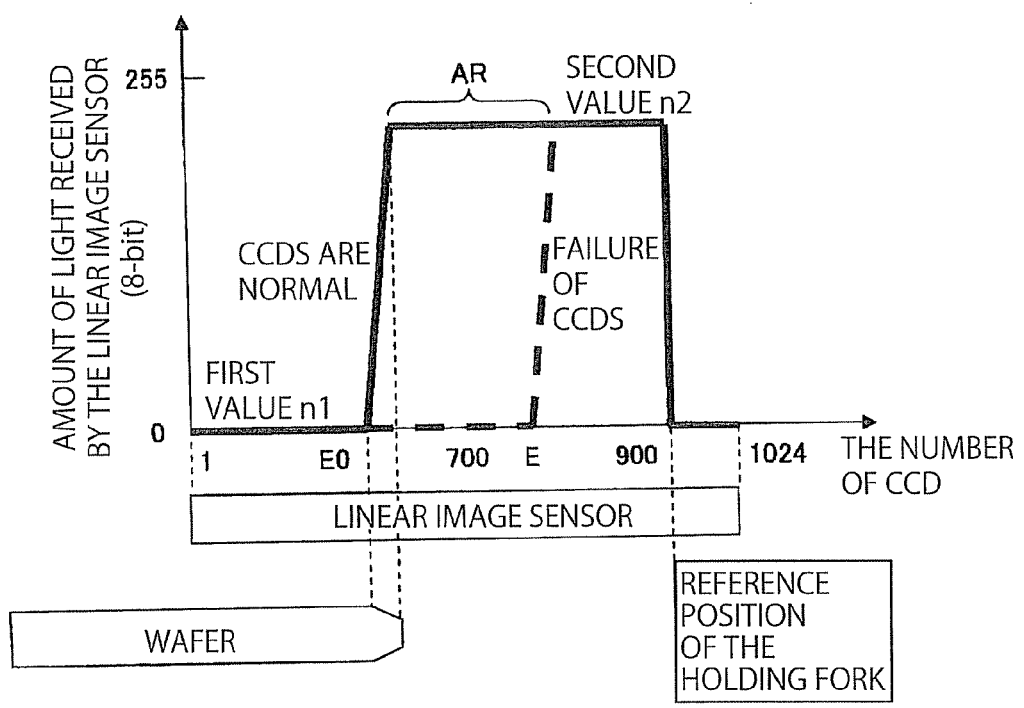
FIG. 22 is a second graph of assistance in explaining making a decision that a linear image sensor is abnormal, typically showing the amounts of light respectively received by the image sensing elements of a linear image sensor.

A method of detecting a trouble in the linear image sensor 52 will be described with reference to FIGS. 21 and 22. FIGS. 21 and 22 are graphs typically showing the relation between the number of the CCD of the linear image sensor 52 and the amount of light received by the CCD.

When the holding fork 3A is not holding any wafer, the linear image sensor 52 detects the amount of light emitted by the light source 51. A decision can be made as to whether or not the light source is in an abnormal state on the basis of the detected amount of light.

The method of detecting an abnormal state of the linear image sensor 52, similarly to the method of detecting the bend of the holding fork 3A (3B), stores beforehand a measured amount of light emitted by the light source 51 as a reference value. An abnormal state of the linear image sensor 52 can be determined on the basis of the reference value.

Suppose that a trouble, such as a failure of the CCD or CCDs or breakage of some of cables connecting the linear image sensor 51 to the controller 6, occurred in the linear image sensor 52.

Then, the amount of light received by the CCD not shaded by a wafer W held by the light source by the holding fork 3A from light emitted by the light source does not coincide with the second value n2, which is the amount of light to be naturally measured by the CCD. For example, when a defective CCD cannot detect light at all, the defective CCD detects an amount of light different from the second value n2, such as the first value n1. Thus, the controller 6 decides that the linear image sensor 52 is defective if the CCD or CCDs of the linear image sensor 52 measure a value other than the second value n2 when any wafer W is not held by the holding fork 3A.

Suppose that the CCDs in a range AR shown in FIG. 22 are defective. Then, the amounts of light respectively measured by the CCDs in the range AR are equal to the first value n1. Consequently, a position E where the measured value changes from the first value n1 to the second value n2 is different from a position E0 where the measured value changes from the first value n1 to the second value n2 when the linear image sensor 52 is in a normal state; that is, the detected position of the edge of the wafer W is different from the position E0 of the same when none of the CCDs are not defective. The position E0 of the edge of the wafer W when the linear image sensor 52 is normal is stored beforehand and the controller 6 decides that a failure has occurred in the linear image sensor 52 when the detected position E of the edge of the wafer W is different from the stored position E0.

When it is decided, from the change of the measured value, that the number of the defective CCDs is small and the carrying operation for carrying a wafer W may be continued, the wafer W is carried in the transfer step (step S18) and the controller 6 makes the alarm generator 64 generate an alarm upon the completion of the carrying operation. When the number of the defective CCDs is large and it is decided that the linear image sensor 52 is in an abnormal state, the operation for carrying the wafer W is discontinued and an alarm is generated.

The controller 6 compares the reference value detected when the linear image sensor 52 is in a normal state and a detected value detected when the holding fork 3A (3B) holding a wafer W is retracted to decide whether or not the linear image sensor 52 is in an abnormal state.

Since the process can be continued when the linear image sensor 52 is slightly defective, the resist pattern forming system can operate at a high operating ratio. Since the state of the linear image sensor 52 is examined in every carrying cycle, the defective state of the linear image sensor 52 can be immediately detected.

The linear image sensor 52 of this embodiment may be replaced by a camera and the position of a wafer W may be determined from an image formed by the camera. When a camera is employed, positional information about four points on the edge of a wafer W is necessary. Therefore, four cameras are not necessarily needed to obtain positional information about four points on the edge of a wafer W. A single camera capable of obtaining positional information about four points on the edge of a camera may be used. When a single camera is employed, the camera may be supported above the two holding forks 3A and 3B by a support member connected to the base 31.

Similarly to the method using the linear image sensors 52 of this embodiment, a method of obtaining positional information about four points on the edge of a wafer W by using a camera forms an image of the wafer W held by the holding fork 3A (3B) retracted to the home position by the camera, and then the image formed by the camera is processed to obtain positional information about four points on the edge of the wafer W. Then, a query is made to see whether or not any one of the four points coincides with a notch WN formed in the wafer W. If any one of the four points coincides with the notch WN, the position of the holding fork 3A (3B) is adjusted on the basis of positional information about the three points excluding the positional information about the point coinciding with the notch WN.

Second Embodiment

A substrate processing method relating to a second embodiment according to the present embodiment will be described with reference to FIGS. 23 to 25.

A substrate processing method relating to the second embodiment is different from the substrate processing method relating to the first embodiment in that the holding fork is moved relative to the detecting units when any one of the detecting units detects a notch WN in a wafer W.

The substrate processing method is carried out also by the resist pattern forming system in the first embodiment built by combining the substrate processing system and the exposure system and hence the description of the substrate processing system will be omitted.

The substrate processing system is provided, similarly to the substrate processing system in the first embodiment, with four detecting units 5. The number of the necessary detecting units 5 is three or greater. Therefore, one of the four detecting units 5 may be omitted.

Figure 23:
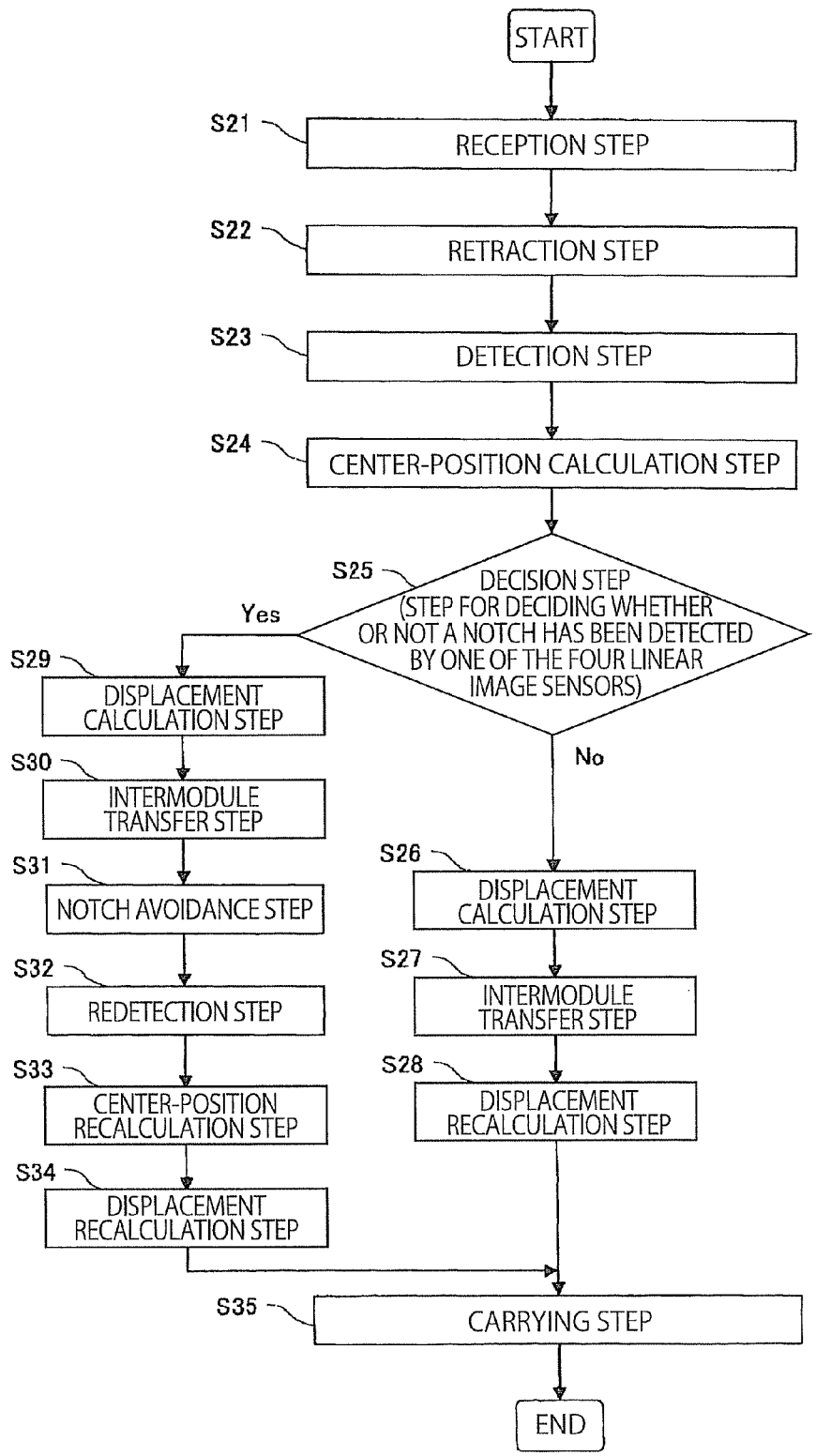
FIG. 23 is a flow chart showing a substrate carrying method.

FIG. 23 is a flow chart of the substrate carrying method. In the following description, it is supposed, by way of example, that the holding fork 3A of the carrying arm A3 receives a wafer W from the heating module 7. The state of the heating module 7 and the carrying arm A3 is the same as that illustrated in FIG. 11.

A reception step (step S21), a retraction step (step S22), a detection step (step S23) and a center-position calculation step (step S24) may be considered to be the same as the reception step (step S11), the retraction step (step S12), the detection step (step S13) and the center-position calculation step (step S14) mentioned above.

In a decision step (step S25) a decision is made as to whether or not any one of the four linear image sensors 52A to 52D detected a notch WN in the edge of the wafer W.

Description will be made on an assumption that none of the linear image sensors 52A to 52D coincide with the notch WN of the wafer W in a plane.

Figure 24:
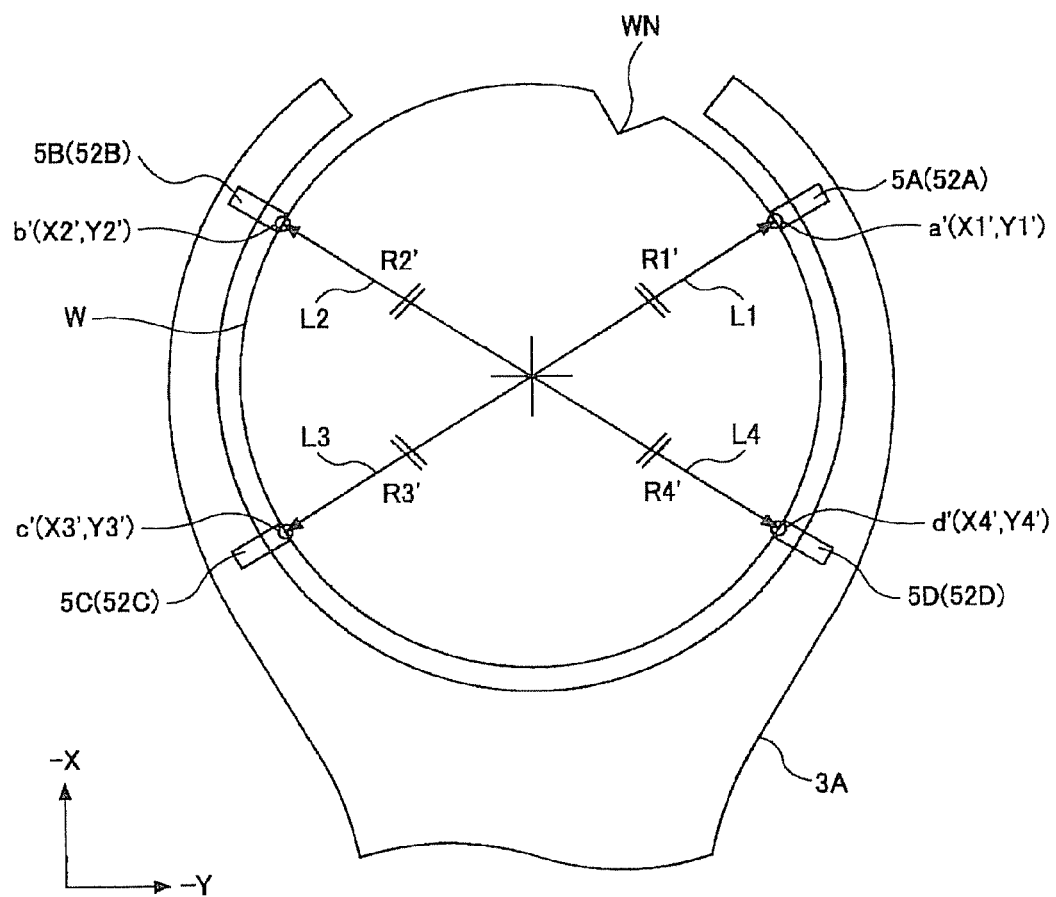
FIG. 24 is an enlarged plan view of a holding fork holding a wafer in a state in which none of the linear image sensors coincide with a notch formed in the wafer.

FIG. 24 is an enlarged plan view showing a state in which the holding fork 3A holding the wafer W and none of the linear image sensors 52A to 52D coincide with the notch WN. In FIG. 24, it is supposed that the wafer W is held at a reference position and the center of the wafer W coincides with the center of the holding fork 3A in a plane to facilitate explanation. As shown in FIG. 24, points a', b', c' and d' on the linear image sensors 52A, 52B, 52C and 52D corresponds to parts of the edge of the wafer W, respectively.

A radius R1' calculated by using Expression (15) and positional data on the points d', a' and b' provided by the linear image sensors 52D, 52A and 52B is typically indicated by a straight line L1 with an arrow head extending from the center of the wafer W to the linear image sensor 52A. A radius R2' calculated by using positional data on the points a', b' and c' provided by the linear image sensors 52A, 52B and 52C is typically indicated by a straight line L2 with an arrow head extending from the center of the wafer W to the linear image sensor 52B. A radius R3' calculated by using positional data on the points b', c' and d' provided by the linear image sensors 52B, 52C and 52D is typically indicated by a straight line L3 with an arrow head extending from the center of the wafer W to the linear image sensor 52C. A radius R4' calculated by using positional data on the points c', d' and a' provided by the linear image sensors 52C, 52D and 52A is typically indicated by a straight line L4 with an arrow head extending from the center of the wafer W to the linear image sensor 52D.

All the radii R1', R2', R3' and R4' are equal to a radius R. Then, it is decided in the decision step (step S25) that none of the four linear image sensors 52A to 52D detected the notch WN of the wafer W.

When it is decided in the decision step (step S25) that none of the four linear image sensors 52A to 52D detected the notch WN of the wafer W, a displacement calculation step (step S26), an intermodule transfer step (step S27) and a displacement recalculation step (step S28) are executed.

The displacement calculation step (step S26) calculates, similarly to the displacement calculation step (step S17), displacements ΔX and ΔY of the calculated center o' at o'(X', Y') from the center o of the wafer W at the reference position o(X, Y) by using Expressions (16) and (17). In the intermodule transfer step (step S27), the carrying arm A3 whose holding fork 3A is holding the wafer W is moved from a preceding processing module to the succeeding processing module. Operations in the displacement recalculation step (step S28) are the same as those of the displacement calculation step (step S26). When it is decided that none of the four linear image sensors 52A to 52D detected the notch WN of the wafer W in the decision step (step S25), the displacement recalculation step (step S28) may be skipped.

Suppose that the notch WN of the wafer W coincides with one of the linear image sensors 52A to 52D in a plane.

Figure 25:
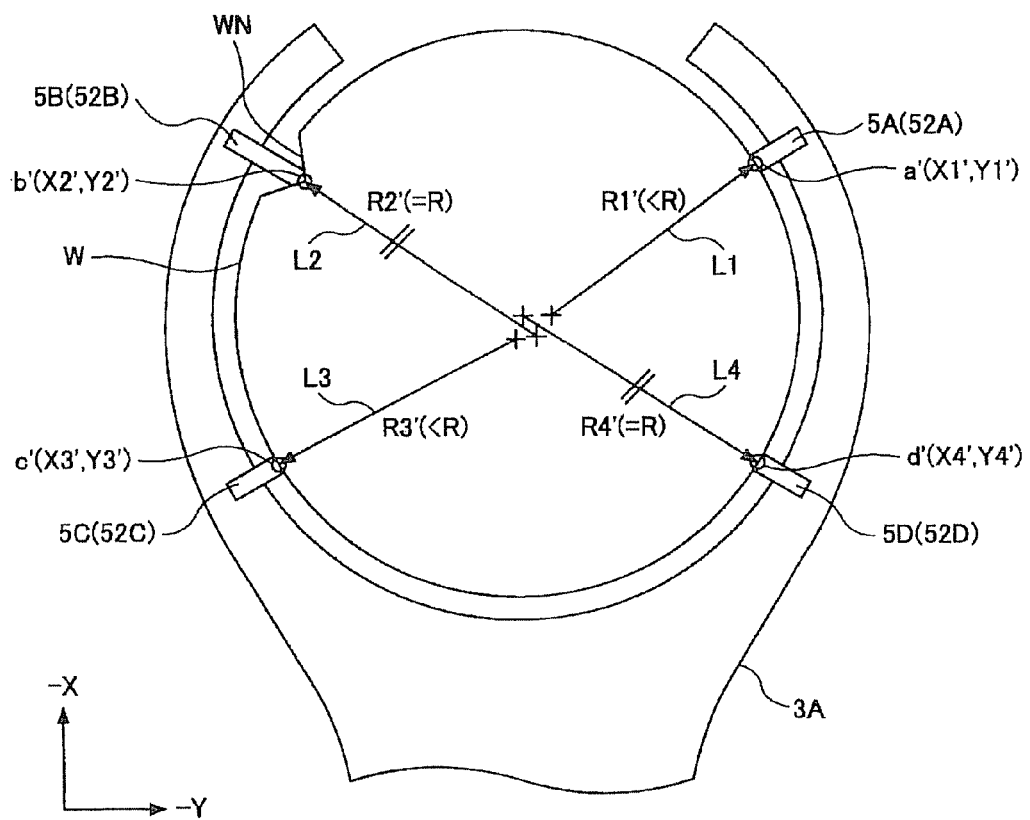
FIG. 25 is an enlarged plan view of a holding fork holding a wafer in a state in which one of the linear image sensors coincides with a notch formed in the wafer.

FIG. 25 is an enlarged plan view of the holding fork 3A holding the wafer W in a state in which one of the linear image sensors 52A to 52D coincides with the notch WN of the wafer W. In FIG. 25, it is supposed that the wafer W is held at the reference position and the center of the wafer W coincides with the center of the holding fork 3A in a plane to facilitate explanation. As shown in FIG. 25, points a', b', c' and d' on the linear image sensors 52 correspond to parts of the edge of the wafer W, respectively.

As shown in FIG. 25, it is supposed that the point b' coincides with the notch WN.

A radius R1' calculated by using positional data on the points d', a' and b' provided by the linear image sensors 52D, 52A and 52B is typically indicated by a straight line L1 with an arrow head extending from a point near the center of the wafer W to the linear image sensor 52A. A radius R2' calculated by using positional data on the points a', b' and c' provided by the linear image sensors 52A, 52B and 52C is typically indicated by a straight line L2 with an arrow head extending from a point near the center of the wafer W to the linear image sensor 52B. A radius R3' calculated by using positional data on the points b', c' and d' provided by the linear image sensors 52B, 52C and 52D is typically indicated by a straight line L3 with an arrow head extending from a point near the center of the wafer W to the linear image sensor 52C. A radius R4' calculated by using positional data on the points c', d' and a' provided by the linear image sensors 52C, 52D and 52A is typically indicated by a straight line L4 with an arrow head extending from a point near the center of the wafer W to the linear image sensor 52D. Expression (15) is used for calculating the radii R1', R2', R3' and R4'.

The radii R2' and R4' are equal to the radius R, and the radii R1' and R3' are slightly shorter than the radius R. Then, it is decided in decision step (step S25) that the notch WN of the wafer W has been detected by some of the four linear image sensors 52A to 52D.

Fundamentally, the radius R2' ought to be different from the radius R. However, the radius R2' is approximately equal to the radius R in some cases. It is considered that the radius R2' is approximately equal to the radius R because the radius R2' calculated by using positional data on the points a', b' and c' is equal to the radius R. Therefore, it can be decided in the decision step (step S25) that the notch WN of the wafer W has been detected by some one of the four linear image sensors 52A to 52D though, it is difficult to decide whether the notch WN is at the point b' or at the point d' in some cases.

In such a case, a displacement recalculation step (step S34) is executed after a displacement calculation step (step S29). Operations in the displacement calculation step (step S29) may be similar to those in the displacement calculation step (step S26). In an intermodule transfer step (step S30), the carrying arm A3 having the holding fork 3A holding the wafer W is moved from a preceding processing module to the succeeding processing module.

In a notch avoidance step (step S31), the holding fork 3A is moved relative to the linear image sensors 52A to 52D such that the notch WN is not detected by any one of the linear image sensors 52A to 52D. More concretely, the holding fork 3A is advanced slightly such that the coincidence of the notch WN with any one of the linear image sensors 52A to 52D is avoided.

Preferably, a distance by which the holding fork 3A is advanced in the notch avoidance step (step S31) is not shorter than a predetermined distance effective in displacing the wafer W such that none of the linear image sensors 52A to 52D detect the notch WN. When the notch WN is a triangular depression having a depth, namely, a dimension along the diameter of the wafer W, of, for example, 1 mm and a circumferential width, namely, a dimension along the circumference of the wafer W, of, for example, 3 mm, the predetermined distance is, for example, 4 mm.

The displacement of the wafer W can be corrected by executing a redetection step (step S32), a center-position recalculation step (step S33) and a displacement recalculation step (step S34). Operations to be carried out in the redetection step (step S32), the center-position recalculation step (step S33) and the displacement recalculation step (step S34), respectively, may be similar to those to be carried out in the detection step (step S23), the center-position calculation step (step S24) and the displacement calculation step (step S26), respectively.

Since the holding fork 3A is moved such that none of the linear image sensors 52A to 52D detect the notch WN in the notch avoidance step (step S31), none of the linear image sensors 52A to 52D coincide with the notch WN. Therefore, the displacements ΔX and ΔY of the wafer W can be accurately determined by using positional data provided by the three linear image sensors out of the four linear image sensors 52A to 52D in the redetection step (step S32), the center-position recalculation step (step S33) and the displacement recalculation step (step S34).

Then, the wafer W is carried to the succeeding processing module in a carrying step (step S35). The movement of the holding fork 3A is corrected by distances respectively corresponding to the displacements ΔX and ΔY calculated in the displacement recalculation step (step S28 or step S34) such that the wafer W can be transferred to a predetermined position, namely, a transfer position, in the succeeding processing module. The transfer position is corrected in the carrying step (step S35) such that the calculated center position o' coincides with the reference position o.

Preferably, displacements calculated in the displacement calculation step (step S26 or step S29) are not used in the carrying step (step S35) because there is the possibility that an error is made in the intermodule transfer step (step S27 or step S30) after the displacement calculation step (step S26 or step S29) has been completed and before the displacement recalculation step (step S28 or step S34) is executed. If the displacements calculated in the displacement calculation step (step S26 or step S29) and those calculated in the displacement recalculation step (step S28 or step S34) are equal, the displacements calculated in the displacement calculation step (step S26 or step S29) may be used.

The substrate carrying operation is ended when the wafer W is transferred to the substrate support unit of the succeeding processing module after the carrying step (step S35).

In this embodiment, the displacement of the wafer W can be accurately measured by executing the decision step (step S25) and the notch avoidance step (step S31) even if the wafer W is provided with a notch WN and errors in the displacement can be readily corrected. A positional error of the displaced wafer W can be accurately measured when a holding fork not provided with the guide structure for guiding the wafer W to a predetermined position on the holding fork is used and the positional error can be readily corrected.

Since this embodiment executes the notch avoidance step (step S31), the number of the detecting units 5 does not necessarily need to be four and may be three.

The second embodiment, similarly to the first embodiment, can detect the extraordinary bend of the holding fork, an abnormal state of the wafer W, malfunction of the light source and malfunction of the linear image sensor. The second embodiment either generates an alarm upon the completion of the carrying operation or discontinues the carrying operation and generates an alarm, depending on the degree of a trouble that occurred in the resist film forming system.

First Modification of Second Embodiment

A substrate processing method in a first modification of the second embodiment according to the present embodiment will be described with reference to FIG. 26.

The substrate processing method in this modification is different from the substrate processing method in the second embodiment in that the holding fork is moved relative to the detecting units during the intermodule transfer step in which a wafer W is moved to the succeeding processing module when any one of the detecting units detects the notch WN of the wafer W.

A substrate processing method in this modification is the same as the substrate processing method in the first embodiment and is carried out by the resist pattern forming system built by connecting the exposure system to the coating and developing system and hence the description of the substrate processing system will be omitted.

This modification, similarly to the second embodiment, needs at least three detecting units 5 and hence one of the four detecting units 5 may be omitted.

Figure 26:
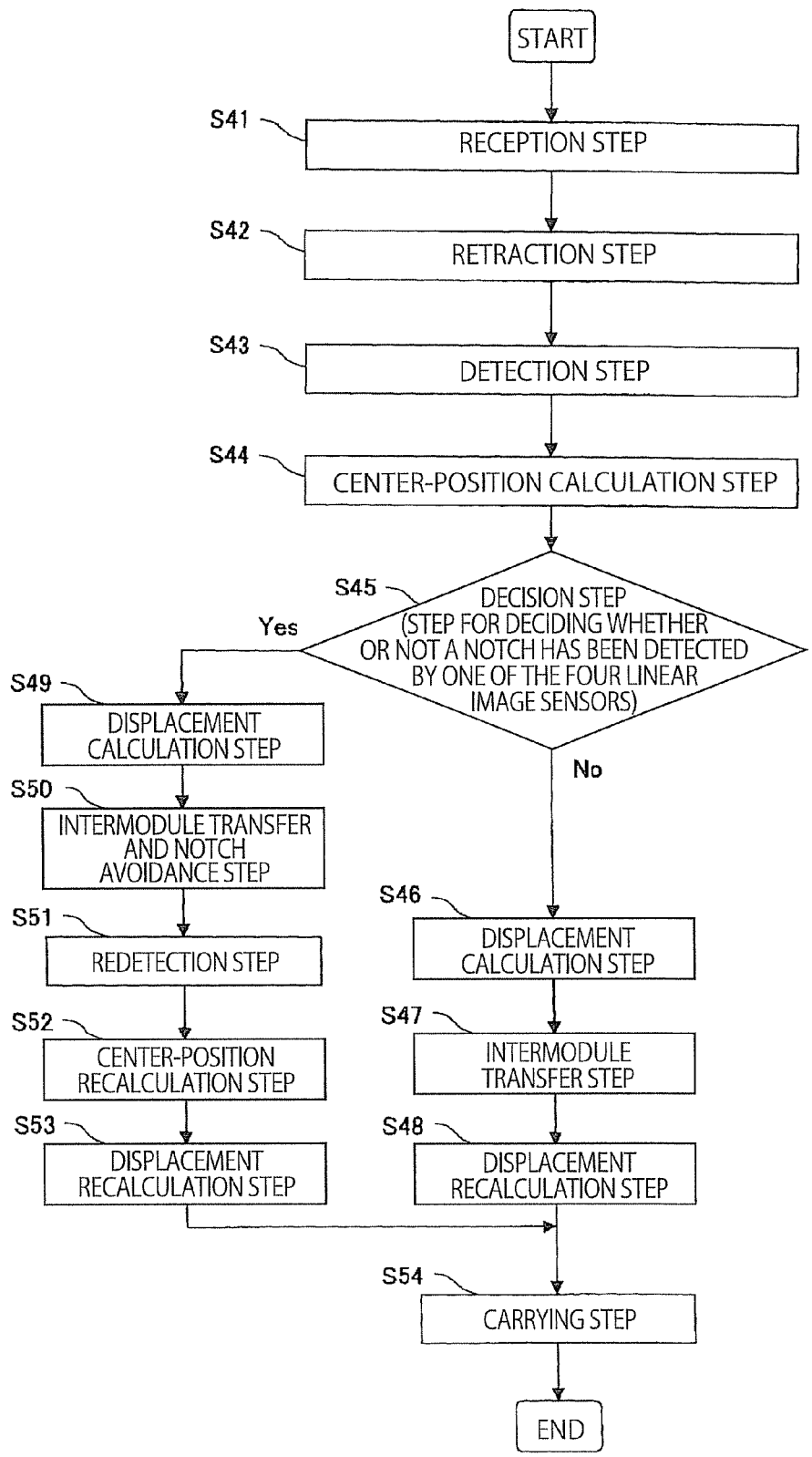
FIG. 26 is a flow chart of a substrate carrying method.

FIG. 26 is flow chart of a substrate carrying method. The substrate carrying method relating to this modification will be described on an assumption that holding fork 3A of the carrying arm. A3 receives a wafer W from the heating module 7 by way of example. The state of the heating module 7 and the carrying arm A3 when the wafer W is transferred from the heating module 7 to the carrying arm A3 is the same as that illustrated in FIGS. 11A to 11E.

Operations in a reception step (step S41), a retraction step (step S42), a detection step (step S43), a center-position calculation step (step S44), a decision step (step S45), a displacement calculation step (step S46), an intermodule transfer step (step S47) and a displacement recalculation step (step S48) may be the same as those in the reception step (step S21), the retraction step (step S22), the detection step (step S23), the center-position calculation step (step S24), the decision step (step S25), the displacement calculation step (step S26), the intermodule transfer step (step S27) and the displacement recalculation step (step S28) of the second embodiment, respectively.

In this modification, when it is decided that the notch WN of the wafer W has been detected by one of the four linear image sensors 52A to 52D, an intermodule transfer and notch avoidance step (step S50) is executed after a displacement calculation step (step S49) has been completed. The operation in the displacement calculation step (step S49) may be similar to that in the displacement calculation step (step S46).

In the intermodule transfer and notch avoidance step (step S50), the carrying arm 3A having the holding fork 3A holding the wafer W is moved from the preceding processing module to the succeeding processing module. The holding fork 3A is moved relative to the linear image sensors 52A to 52D such that the notch WN is not detected by any one of the linear image sensors 52A to 52D. A redetection step (step S51), a center-position recalculation step (step S52) and a displacement recalculation step (step S53) are executed after the intermodule transfer and notch avoidance step (step S50). Operations in the redetection step (step S51), the center-position recalculation step (step S52) and the displacement recalculation step (step S53) may be the same as those in the detection step (step S43), the center-position calculation step (step S44) and the displacement calculation step (step S46), respectively.

Since the holding fork 3A is moved relative to the linear image sensors 52A to 52D in the intermodule transfer and notch avoidance step (step S50), the notch WN does not coincide with any one of the linear image sensors 52A to 52D. Therefore, displacements ΔX and ΔY of the wafer W can be accurately calculated by using positional data provided by the three linear image sensors out of the four linear image sensors 52A to 52D in the redetection steps (step S51), the center-position recalculation step (step S52) and the displacement recalculation step (step S53).

In a carrying step (step S54), an error in a transfer position where the wafer W is transferred to the succeeding processing module is corrected such that the calculated center position o' coincides with the reference position o.

Preferably, displacements calculated in the displacement calculation step (step S46 or step S49) are not used in the carrying step (step S54) because there is the possibility that an error is made in the intermodule transfer step (step S47) or the intermodule transfer and notch avoidance step (step S50) after the displacement calculation step (step S46 or step S49) has been completed and before the displacement recalculation step (step S48 or step S53) is executed. If the displacements calculated in the displacement calculation step (step S46 or step S49) and those calculated in the displacement recalculation step (step S48 or step S53) are equal, the displacements calculated in the displacement calculation step (step S46 or step S49) may be used.

The substrate carrying operation is ended when the wafer W is transferred to the substrate support unit of the succeeding processing module after the carrying step (step S54).

This modification can accurately measure the displacement of a wafer W provided with a notch WN by executing the decision step (step S45) and the intermodule transfer and notch avoidance step (step S50) while the wafer W held by the holding fork is being carried and an error in the displaced wafer W can be readily corrected. Even in a case where a wafer W is carried by the holding fork not provided with the guide structure, the displacement of the wafer W can be correctly measured and a positional error of the wafer W corresponding to the displacement can be readily corrected.

Since this modification executes the intermodule transfer and notch avoidance step (step S50), the number of the detecting units 5 is not necessarily four and may be three.

This modification, similarly to the first embodiment, can detect the extraordinary bend of the holding fork, an abnormal state of a wafer W, malfunction of the light source and malfunction of the linear image sensor. This modification either generates an alarm upon the completion of the carrying operation or discontinues the carrying operation and generates an alarm, depending on the degree of a trouble that occurred in the resist film forming system.

Second Modification of Second Embodiment

A substrate processing method in a second modification of the second embodiment will be described with reference to FIG. 27.

The substrate processing method in the second modification differs from the substrate processing method in the second embodiment in that displacements of a wafer W is measured again after the wafer W has been carried to the succeeding processing module.

The substrate processing method in this modification is the same as the substrate processing method in the first embodiment and is carried out by the resist pattern forming system built by connecting the exposure system to the coating and developing system and hence the description of the substrate processing system will be omitted.

This modification, similarly to the second embodiment, needs at least three detecting units 5 and hence one of the four detecting units 5 may be omitted.

Figure 27:
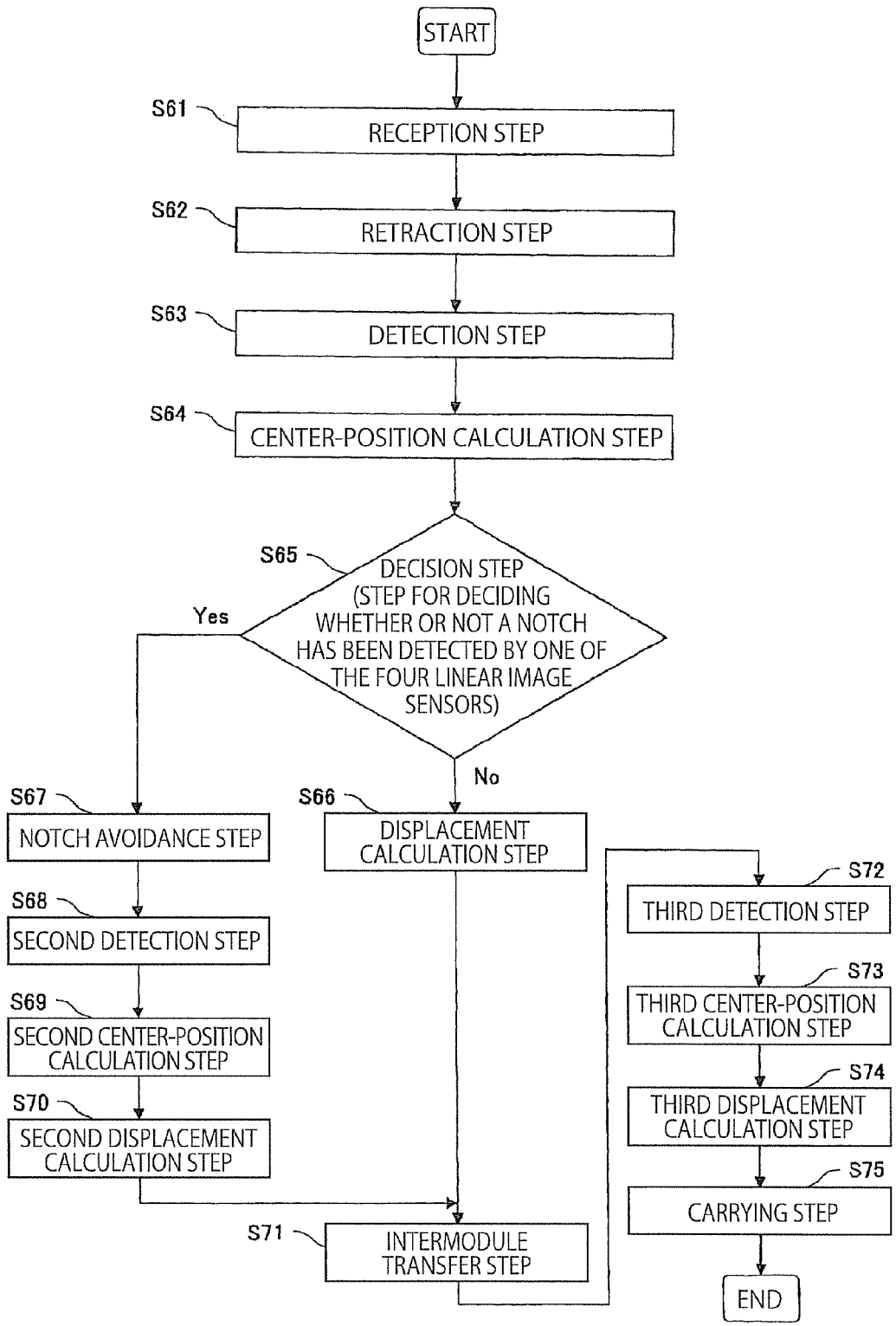
FIG. 27 is a flow chart of a substrate carrying method.

FIG. 27 is a flow chart of a substrate carrying method. The substrate carrying method in this modification will be described on an assumption that the holding fork 3A of the carrying arm A3 receives a wafer W from the heating module 7 by way of example. The state of the heating module 7 and the carrying arm A3 when the wafer W is transferred from the heating module 7 to the carrying arm A3 is the same as that illustrated in FIGS. 11A to 11E.

Operations in a reception step (step S61), a retraction step (step S62), a detection step (step S63), a center-position calculation step (step S64), a decision step (step S65), a displacement calculation step (step S66), a notch avoidance step (step S67), a second detection step (step S68), a second center-position detection step (step S69), a second displacement calculation step (step S70) and an intermodule transfer step (step S71) may be the same as those in the reception step (step S21), the retraction step (step S22), the detection step (step S23), the center-position calculation step (step S24), the decision step (step S25), the displacement calculation step (step S26), the notch avoidance step (step S31), the redetection step (step S34) and the intermodule transfer step (step S27 or step S30) of the second embodiment, respectively.

In this modification, a third detection step (step S72), a third center-position calculation step (step S73), a third displacement calculation step (step S74) and a carrying step (step S75) are executed after the intermodule transfer step (step S71). Operations in the third detection step (step S72), the third center-position calculation step (step S73) and the third displacement calculation step (step S74) are the same as those in the detection step (step S63), the center-position calculation step (step S64) and the displacement calculation step (step S66), respectively. Thus, displacements by which the wafer W is moved during the transfer of the wafer W to the succeeding processing module can be measured after displacements have been measured for the first time in the displacement calculation step (step S66) or the second displacement calculation step (step S70).

In the carrying step (step S75) following the third displacement calculation step (step S74), an error in a transfer position where the wafer W is transferred to the succeeding processing module such that a calculated center position o' coincides with the reference position o.

Preferably, displacements calculated in the displacement calculation step (step S66) are not used in the carrying step (step S75) because there is the possibility that an error is made in the intermodule transfer step (step S71) after the displacement calculation step (step S66) has been completed and before the third displacement calculation step (step S74) is executed. If the displacements calculated in the displacement calculation step (step S66) and those calculated in the third displacement calculation step (step S74) are equal, the displacements calculated in the displacement calculation step (step S66) may be used.

The substrate carrying operation is ended when the wafer W is transferred to the substrate support unit of the succeeding processing module after the carrying step (step S75).

In this modification, the displacement of the wafer W can be accurately measured by executing the decision step (step S65) and the notch avoidance step (step S67) even if a wafer W is provided with a notch WN and errors in the displacements can be readily corrected. A positional error of the displaced wafer W can be accurately measured when the holding fork not provided with the guide structure for guiding the wafer W to a predetermined position on the holding fork is used and the positional error can be readily corrected.

In this modification, the notch avoidance step (step S67) may be executed by using the three detecting units out of the four detecting units 5.

This modification, similarly to the first embodiment, can detect the extraordinary bend of the holding fork, an abnormal state of the wafer W, malfunction of the light source and malfunction of the linear image sensor. This modification either generates an alarm upon the completion of the carrying operation or discontinues the carrying operation and generates an alarm, depending on the degree of a trouble.

Although the invention has been specifically described in its preferable embodiments, the present embodiment is not limited in its practical application to the specific embodiments described herein and various changes and modifications are possible therein without departing from the scope of the invention.

The invention claimed is:

1. A substrate carrying mechanism for carrying a substrate between a plurality of processing units comprising:
   a movable base for carrying a substrate between the plurality of processing units;
   a substrate holding member placed on the base and capable of holding a substrate and of being advanced and retracted relative to the base;
   four or more detecting units respectively for detecting different parts of an edge of a substrate held by the substrate holding member when the substrate holding member holding the substrate is retracted; and
   a controller that determines whether or not a notch formed in the edge of the substrate has been detected by one of the detecting units on the basis of measurements measured by the four or more detecting units and corrects an error in a transfer position where the substrate is to be transferred to the succeeding processing unit on the basis of measurements measured by the detecting units excluding the one detecting unit that has detected the notch of the substrate.

2. The substrate carrying mechanism according to claim 1, wherein the controller calculates a position of a center of the substrate by using positions of the parts of the edge of the substrate detected by the detecting units, and executes a control operation such that the calculated position of the center of the substrate coincides with a predetermined position.

3. The substrate carrying mechanism according to claim 1, wherein the controller compares a position to which the substrate holding member holding the substrate has been retracted with a reference position of the substrate holding member to decide a state of a shape of the substrate holding member.

4. The substrate carrying mechanism according to claim 1, wherein a plurality of substrate holding members are arranged so as to be superposed, and the detecting units detect a position of an edge of a substrate held by one of the substrate holding members when the substrate holding member holding the substrate is retracted.

5. The substrate carrying mechanism according to claim 1, wherein each of the detecting units includes a light source and a light-sensing device formed by arranging a plurality of light-sensing elements, disposed opposite to each other on the opposite sides, respectively, of a substrate held by the retracted substrate holding member.

6. A substrate carrying mechanism for carrying a substrate between a plurality of processing units comprising:
    a movable base for carrying a substrate between the plurality of units;
    a substrate holding member capable of holding a substrate and of being advanced and retracted relative to the base;
    three detecting units that detect different parts of an edge of a substrate held by the substrate holding member when the substrate holding member holding the substrate is retracted; and
    a controller that decides whether or not a part of a notch formed in an edge of a substrate received from a processing unit has been detected by one of the detecting units on the basis of measurements measured by the three detecting units, moves the substrate holding unit relative to the detecting units such that no part of the notch will be detected by any one of the detecting units when it is decided that a part of the notch has been detected by one of the detecting units, makes the detecting units detect parts of the edge of the substrate after the substrate holding unit has been moved relative to the detecting units, and determines a transfer position where the substrate is to be transferred to the succeeding processing unit on the basis of measurements measured by the detecting units after the substrate holding unit has been moved relative to the detecting units.

7. The substrate carrying mechanism according to claim 6, wherein the controller calculates a position of a center of the substrate by using positions of the parts on the edge of the substrate detected by the detecting units, and executes a control operation such that the calculated position of the center of the substrate coincides with a predetermined position.

8. The substrate carrying mechanism according to claim 6, wherein the controller compares a position to which the substrate holding member holding the substrate has been retracted with a reference position of the substrate holding member to decide a state of a shape of the substrate holding member.

9. The substrate carrying mechanism according to claim 6, wherein a plurality of substrate holding members are arranged so as to be superposed, and the detecting units detect a position of an edge of a substrate held by the substrate holding member when the substrate holding member holding the substrate is retracted.

10. The substrate carrying mechanism according to claim 6, wherein each of the detecting units includes a light source and a light-sensing device formed by arranging a plurality of light-sensing elements, disposed opposite to each other on the opposite sides, respectively, of a substrate held by the retracted substrate holding member.

11. A substrate carrying method to be carried out by a substrate carrying mechanism for carrying a substrate between a plurality of processing units including a movable base for carrying a substrate between the plurality of processing units, a substrate holding member placed on the base and capable of being advanced and retracted relative to the base, and four or more detecting units for detecting different parts of an edge of a substrate held by the substrate holding member when the substrate holding member holding a substrate received from a processing unit is retracted, said substrate carrying method comprising the steps of:
    detecting different parts of the edge of a substrate held by the substrate holding member when the substrate holding member holding the substrate received from the processing unit is retracted;
    deciding whether or not a part of a notch formed in an edge of a substrate received from a processing unit has been detected by one of the detecting units on the basis of measurements measured by the detecting units; and
    determining, if a part of the notch formed in the edge of the substrate received from the processing unit has been detected by one of the detecting units, a transfer position where the substrate is to be transferred to the succeeding processing unit on the basis of the measurements measured by the detecting units excluding the one detecting unit that has detected the part of the notch of the substrate.

12. The substrate carrying method according to claim 11, wherein a position of a center of the substrate is calculated by using positions of parts of the edge of the substrate detected by the detecting units, and a control operation is executed such that the calculated position of the center of the substrate coincides with a predetermined position.

13. The substrate carrying method according to claim 11, wherein a position to which the substrate holding member holding a substrate has been retracted is compared with a reference position of the substrate holding member to decide a state of a shape of the substrate holding member.

14. The substrate carrying method according to claim 11, wherein a plurality of substrate holding members are arranged so as to be superposed, and the detecting units detect a position of an edge of a substrate held by one of the substrate holding members when the substrate holding member holding the substrate is retracted.

15. The substrate carrying method according to claim 11, wherein each of the detecting units includes a light source and a light-sensing device formed by arranging a plurality of light-sensing elements, disposed opposite to each other on the opposite sides, respectively, of a substrate held by the retracted substrate holding member.

16. A substrate carrying method, to be carried out by a substrate carrying mechanism for carrying a substrate between a plurality of processing units including a movable base for carrying a substrate between the plurality of processing units, a substrate holding member capable of holding a substrate and of being advanced and retracted relative to the base, and three detecting units that detect different parts of an edge of a substrate held by the substrate holding member when the substrate holding member holding the substrate is retracted, comprising the steps of:

detecting different parts of the edge of the substrate held by the substrate holding member when the substrate holding member holding the substrate received from a processing unit is retracted;

deciding whether or not a part of a notch formed in an edge of a substrate received from a processing unit has been detected by one of the detecting units on the basis of measurements measured by the three detecting units;

moving the substrate holding member relative to the detecting units such that no part of the notch will be detected by any one of the detecting units when it is decided that a part of the notch has been detected by one of the detecting units;

remeasuring positions of parts of the edge of the substrate by the detecting units after the substrate holding member has been moved relative to the detecting units; and determining a transfer position where the substrate is to be transferred to the succeeding processing unit on the basis of measurements remeasured by the detecting units after the holding unit has been moved relative to the detecting units.

17. The substrate carrying method according to claim 16, wherein a position of a center of the substrate is calculated by using positions of parts of the edge of the substrate detected by the detecting units, and a control operation is executed such that the calculated position of the center of the substrate coincides with a predetermined position.

18. The substrate carrying method according to claim 16, wherein a position to which the substrate holding member holding a substrate has been retracted is compared with a reference position of the substrate holding member to decide a state of a shape of the substrate holding member.

19. The substrate carrying method according to claim 16, wherein a plurality of substrate holding members are arranged so as to be superposed, and the detecting units detect a position of an edge of a substrate held by one of the substrate holding members when the substrate holding member holding the substrate is retracted.

20. The substrate carrying method according to claim 16, wherein each of the detecting units includes a light source and a light-sensing device formed by arranging a plurality of light-sensing elements, disposed opposite to each other on the opposite sides, respectively, of a substrate held by the retracted substrate holding member.

\* \* \* \* \*